US012591281B2

(12) United States Patent
Quarmeau et al.

(10) Patent No.: US 12,591,281 B2
(45) Date of Patent: Mar. 31, 2026

(54) RESET OUTPUT WITH OPEN DRAIN CONFIGURATION FOR FUNCTIONAL SAFETY (FUSA) APPLICATIONS

(71) Applicant: SEMICONDUCTOR COMPONENTS INDUSTRIES, LLC, Scottsdale, AZ (US)

(72) Inventors: Philippe Quarmeau, Colomiers (FR); Rastislav Koleno, Bratislava (SK); Zoltan Randlisek, Bratislava (SK); Dieter Jozef Joos, Nieuwenrode (BE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 391 days.

(21) Appl. No.: 18/315,139

(22) Filed: May 10, 2023

(65) Prior Publication Data

US 2024/0377870 A1 Nov. 14, 2024

(51) Int. Cl.
*G06F 1/24* (2006.01)
*G06F 1/3206* (2019.01)
*H03K 17/22* (2006.01)

(52) U.S. Cl.
CPC .............. *G06F 1/24* (2013.01); *G06F 1/3206* (2013.01); *H03K 17/223* (2013.01)

(58) Field of Classification Search
CPC ....... G06F 1/24; G06F 1/3206; H03K 17/223; G05B 19/0423; G05B 2219/25257
See application file for complete search history.

(56) References Cited

U.S. PATENT DOCUMENTS

| | | | |
|---|---|---|---|
| 2008/0211537 A1 | 9/2008 | Tsuda | |
| 2013/0170087 A1* | 7/2013 | Ge | H02H 11/006 |
| | | | 361/92 |
| 2013/0170187 A1 | 7/2013 | Chen et al. | |
| 2018/0299945 A1 | 10/2018 | Pachoud et al. | |

(Continued)

FOREIGN PATENT DOCUMENTS

| | | | | |
|---|---|---|---|---|
| CN | 114665446 A | * | 6/2022 | H02M 1/32 |

OTHER PUBLICATIONS

Kamal et al. (Effect of Body Biasing on 0.13 Um CMOS Transistor; International Journal of Innovative Technology and Exploring Engineering (IJITEE), vol. 9, Issue 2, Dec. 2019) (Year: 2019).*

(Continued)

*Primary Examiner* — Lincoln D Donovan
*Assistant Examiner* — Amit R Bhatia
(74) *Attorney, Agent, or Firm* — Dickinson Wright PLLC; James P. Purrington, Jr.

(57) ABSTRACT

Reset output with open drain configuration for functional safety (FUSA) applications. Example embodiments include methods of operating an output of an integrated circuit (IC) including determining an error condition in the IC; generating a reset signal based on the determining the error condition in the IC; selectively conducting, by a field-effect transistor (FET), a first current between an output terminal and a ground terminal of the IC to drive the output terminal to a low voltage state, and thereby signaling the error condition in the IC; conducting a second current between a signal terminal of the IC and a gate of the FET to drive the FET to a conductive state; and selectively driving, in response to the reset signal, the FET to a non-conductive state.

15 Claims, 11 Drawing Sheets

(56) References Cited

U.S. PATENT DOCUMENTS

| 2020/0300910 | A1 | 9/2020 | Kutz et al. | |
| 2024/0170044 | A1* | 5/2024 | Redaelli | G11C 5/141 |

OTHER PUBLICATIONS

English Translation of CN_114665446_A (Year: 2022).*
Kamal, N. Fauzi, N. M.: Effect of Body Biasing on 0.13 Um CMOS Transistor. In: International Journal of Innovative Technology and Exploring Engineering (IJITEE), vol. 9, No. 2, Dec. 2019. URL: https://www.ijitee.org/wp-content/uploads/papers/v9i2/B7817129219.pdf [abgerufen am Sep. 25, 2024].

* cited by examiner

RESET OUTPUT WITH OPEN DRAIN CONFIGURATION FOR FUNCTIONAL SAFETY (FUSA) APPLICATIONS

CROSS-REFERENCE TO RELATED APPLICATIONS

Not Applicable.

BACKGROUND

Vehicles, such as passenger cars and trucks, may include several different advanced driver assistance systems (ADAS) that assist drivers in driving and parking functions. Examples of such ADAS include adaptive cruise control and lane keeping assistance systems. An ADAS controller may receive supply power from a Power Management Integrated Circuit (PMIC).

A PMIC device used for safety applications may conform to a functional safety (FUSA) standard, such as the ISO 26262 standard. One of the functional safety (FUSA) functions is to report any failure or error (e.g. interruption of power and/or an output voltage outside of one or more predetermined limits) to a safety microcontroller unit (MCU) by an interrupt (INTB) or reset (RSTB) signal. To provide the INTB or RSTB signal, the PMIC may include a reset output (RO) having an open drain configuration with an external pull up-resistor connected to a same node that supplies power to the PMIC. In case a failure occurs, the PMIC may pull the RO to a low state (e.g. below 0.4V) to report the failure to the MCU. In some applications, the reporting function is also used to indicate a failure in the PMIC.

One possible failure in the PMIC can include loss of a bonding wire on the terminal supplying power to the PMIC. In case of such a bonding wire failure, the PMIC may be unable to drive the RO to the low state, preventing the PMIC from providing information about failures to the safety MCU. An additional supply power source or a second bond wire connected in parallel with the terminal supplying power to the PMIC may be used to provide redundancy in case of a bonding wire failure. In some cases, it may not be possible or practical to include two supply power sources or a second bonding wire in the PMIC.

SUMMARY

One example is a method of operating an output of an integrated circuit (IC), comprising: determining an error condition in the IC; generating a reset signal based on the determining the error condition in the IC; selectively conducting, by a field-effect transistor (FET), a first current between an output terminal and a ground terminal of the IC to drive the output terminal to a low voltage state, thereby signaling the error condition in the IC; conducting a second current between a signal terminal of the IC and a gate of the FET to drive the FET to a conductive state; and selectively driving, in response to the reset signal, the FET to a non-conductive state.

In the example method, the signal terminal of the IC may be the output terminal.

The example method may further comprise: generating a regulated output power having an output voltage; and comparing the output voltage with a minimum threshold voltage value to determine the output voltage being below the minimum threshold voltage value, wherein determining the error condition in the IC includes determining the output voltage being below the minimum threshold voltage value.

In the example method, conducting the second current to drive the FET to the conductive state may include conducting the second current via an internal pull-up resistor of the IC to apply a voltage on the gate of the FET in excess of a threshold voltage, and thereby driving the FET to the conductive state.

In the example method, the FET may be an N-type metal-oxide-semiconductor (NMOS) device having a threshold voltage between 0 Volts and an output low signal voltage, wherein driving the FET to the conductive state may include applying a voltage on the gate of the FET in excess of the threshold voltage, and wherein the output terminal having the output low signal voltage may signal the error condition in the IC. The FET may further define a body, and wherein the method may further comprise lowering the threshold voltage of the FET by applying a positive direct current (DC) voltage to the body of the FET.

In the example method, the FET may be an N-type metal-oxide-semiconductor (NMOS) device having a threshold voltage that is less than 0 Volts. And the method may further comprise selectively driving, by a negative voltage charge pump (NVCP), a gate voltage of the FET below the threshold voltage to drive the FET to the non-conductive state. The method may further comprise: selectively conducting, for a period of time after an ending of the reset signal, a third current between the output terminal and the ground terminal of the IC; wherein the period of time may be longer than a pull-up time for the second current to drive the FET from a non-conductive state and to the conductive state. The method may further comprise selectively conducting, for a period of time after a beginning of the reset signal, a third current between the output terminal and the ground terminal of the IC.

Yet another example is an integrated circuit (IC), comprising: a control circuit defining a reset terminal and configured to determine an error condition in the IC and to generate a reset signal on the reset terminal, based on determining the error condition in the IC; a field-effect transistor (FET) defining a drain connected to an output terminal of the IC, and a source connected to a ground terminal of the IC, the FET configured to selectively conduct a first current between the output terminal and the ground terminal to drive the output terminal to a low voltage state, thereby signaling the error condition in the IC; an internal pull-up resistor connected between a signal terminal of the IC and a gate of the FET to conduct a second current therebetween and to drive the FET to a conductive state; and a FET driver circuit connected to the reset terminal of the control circuit and configured to selectively drive the FET to a non-conductive state in response to the reset signal.

In the example IC, the signal terminal of the IC may be the output terminal.

The example IC may further comprise: a power regulator connected to a power output terminal of the IC and configured to supply power to the power output terminal at an output voltage; wherein the control circuit may be further configured to compare the output voltage on the power output terminal with a minimum threshold voltage value to determine the error condition in the IC by determining the output voltage being below the minimum threshold voltage value.

In the example IC, conducting the second current to drive the FET to the conductive state may include conducting the second current through the internal pull-up resistor to apply a voltage on the gate of the FET in excess of a threshold voltage, and thereby driving the FET to the conductive state.

In the example IC, the FET may be an N-type metal-oxide-semiconductor (NMOS) device having a threshold voltage between 0 Volts and an output low signal voltage, wherein driving the FET to the conductive state may include applying a voltage on the gate of the FET in excess of the threshold voltage, and wherein the output terminal having the output low signal voltage may signal the error condition in the IC. The FET further may define a body; and wherein the IC further may include a voltage source connected between the body of the FET and the ground terminal of the IC to apply a DC bias voltage to the body, and thereby lowering the threshold voltage of the FET.

In the example IC, the FET may be an N-type metal-oxide-semiconductor (NMOS) device having a threshold voltage that is less than 0 Volts. The FET driver circuit may comprise a negative voltage charge pump (NVCP) configured to selectively drive a gate voltage of the FET below the threshold voltage to drive the FET to the non-conductive state in response to the reset signal.

The example IC may further comprise an RO driver circuit, including: a second FET defining a drain connected to the output terminal of the IC, and a source connected to the ground terminal of the IC, and configured to selectively conduct a third current between the output terminal and the ground terminal of the IC; a voltage regulator configured to produce a filtered operating voltage on a common node using an operating power from an input terminal of the IC; a capacitor connected between the common node and the ground terminal to maintain the filtered operating voltage on the common node; and a third FET defining a drain connected to a gate of the second FET, and a source connected to the common node; wherein the third FET may be configured to selectively conduct a fourth current between the common node and the gate of the second FET to drive the second FET to a conductive state, thereby conducting the third current between the output terminal and the ground terminal of the IC for a period of time after an ending of the reset signal, while the capacitor maintains the filtered operating voltage at a value sufficient to drive the second FET to a conductive state; and wherein the period of time may be longer than a pull-up time for the second current to drive the FET from the non-conductive state to the conductive state.

Yet another example is a power supply circuit for a system in a vehicle, comprising: a power source having a power output terminal; a safety microcontroller unit (MCU) having a signal input terminal; and a power management integrated circuit (PMIC). The PMIC may include: a voltage input terminal, a ground terminal, a power output terminal, and a signal output terminal, wherein the voltage input terminal is connected to the power output terminal of the power source for receiving power therefrom, and wherein the signal output terminal is connected to the signal input terminal of the safety MCU for signaling an error condition in the PMIC; a control circuit defining a reset terminal and configured to determine the error condition in the PMIC and to generate a reset signal on the reset terminal based on determining the error condition in the PMIC; a field-effect transistor (FET) defining a drain connected to the signal output terminal, and a source connected to the ground terminal, the FET configured to selectively conduct a first current between the signal output terminal and the ground terminal to drive the signal output terminal to a low voltage state, thereby signaling the error condition in the PMIC; an internal pull-up resistor connected between the signal output terminal and a gate of the FET to conduct a second current therebetween and to drive the FET to a conductive state; and a FET driver circuit connected to the reset terminal of the control circuit and configured to selectively drive the FET to a non-conductive state in response to the reset signal.

BRIEF DESCRIPTION OF THE DRAWINGS

For a detailed description of example embodiments, reference will now be made to the accompanying drawings in which.

DEFINITIONS

Figure 1:
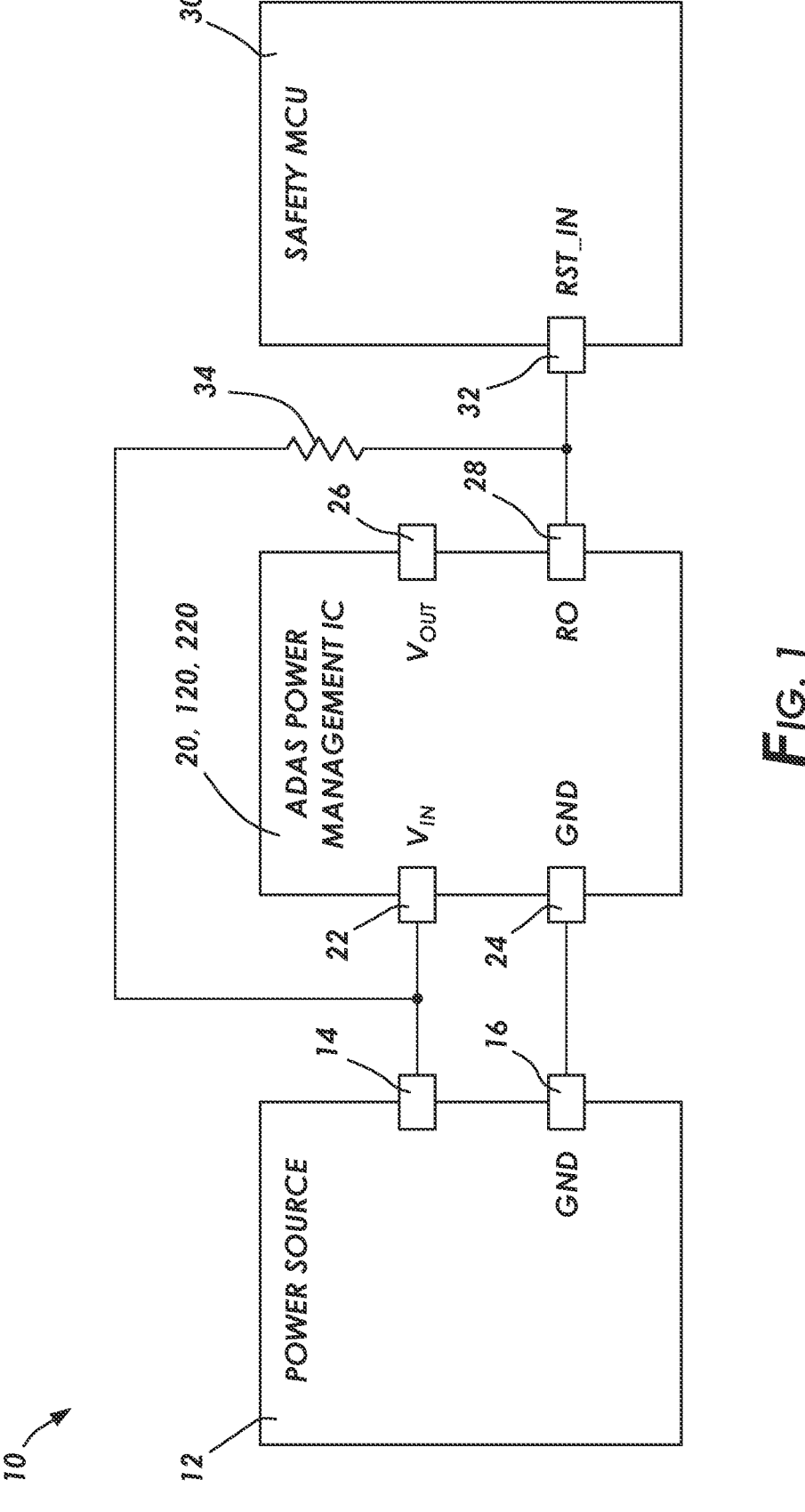
FIG. 1 shows a block diagram of an ADAS power supply circuit in accordance with at least some embodiments.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

"Controller" shall mean, alone or in combination, individual circuit components, an application specific integrated circuit (ASIC), a microcontroller with controlling software, a reduced-instruction-set computing (RISC) with controlling software, a digital signal processor (DSP), a processor with controlling software, a programmable logic device (PLD), a field programmable gate array (FPGA), or a programmable system-on-a-chip (PSOC), configured to read inputs and drive outputs responsive to the inputs.

In relation to electrical devices, the terms "input" and "output" refer to electrical connections to the electrical devices, and shall not be read as verbs requiring action. For example, a controller may have a gate output and one or more sense inputs.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Example embodiments are directed to a power management integrated circuit (PMIC) for converting a direct current (DC) input voltage $V_{IN}$ from a power source to an output voltage $V_{OUT}$ to be supplied to one or more advanced driver assistance system (ADAS) devices, such as an ADAS controller and/or one or more sensors. The power source may include a power management controller, a battery, a power distribution panel, or another power supply or converter circuit.

PMICs constructed in accordance with the present disclosure may provide several advantages over related-art designs. For example, the present disclosure may enable PMICs that can provide a reset output signal that maintains a correct (low-level) value in the event of a loss of a bonding wire on a voltage input terminal, and without redundancy in the voltage input terminal or extra bond wires connected thereto. PMICs constructed in accordance with the present disclosure may be used to meet functional safety (FUSA) requirements. The specification now describes an example ADAS power supply circuit 10 to orient the reader.

FIG. 1 shows a block diagram of an ADAS power supply circuit 10 for supplying regulated DC power for one or more ADAS devices in a motor vehicle, such as a passenger car or truck. The ADAS power supply circuit 10 includes a power source 12, such as a battery, a power distribution panel, or a DC/DC converter. The ADAS power supply circuit 10 also includes a PMIC 20, 120, 220 having a voltage input terminal 22, a ground terminal 24, a power output terminal 26, and a reset output (RO) terminal 28. The voltage input terminal 22 of the PMIC 20, 120, 220 is connected to the power output terminal 14 of the power source 12 for receiving power therefrom, and the ground terminal 24 of the PMIC 20, 120, 220 is connected to the ground terminal 16 of the power source 12. The PMIC 20, 120, 220 is configured to generate an output voltage on the power output terminal 26 for supplying power to a load, such as an ADAS controller and/or one or more sensors (not shown on the Figures).

The ADAS power supply circuit 10 also includes a safety microcontroller unit (MCU) 30 having a reset input terminal 32 that is connected to the RO terminal 28 of the PMIC 20, 120, 220. An external pull-up resistor 34 is connected between the RO terminal 28 of the PMIC 20, 120, 220 and the power output terminal 14 of the power source 12 for biasing the reset input terminal 32 of the safety MCU 30 to a high voltage state, with a voltage above a corresponding threshold voltage, unless the RO terminal 28 of the PMIC 20, 120, 220 is active to pull the reset input terminal 32 of the safety MCU 30 to a low voltage state with a voltage below the corresponding state threshold voltage, indicating an error condition in the PMIC 20, 120, 220, such as the output voltage $V_{OUT}$ on the power output terminal 26 being outside of one or more predetermined limits. The external pull-up resistor 34 may have a resistance of 10 kΩ. However, the external pull-up resistor 34 may have a different resistance value.

Figure 2:
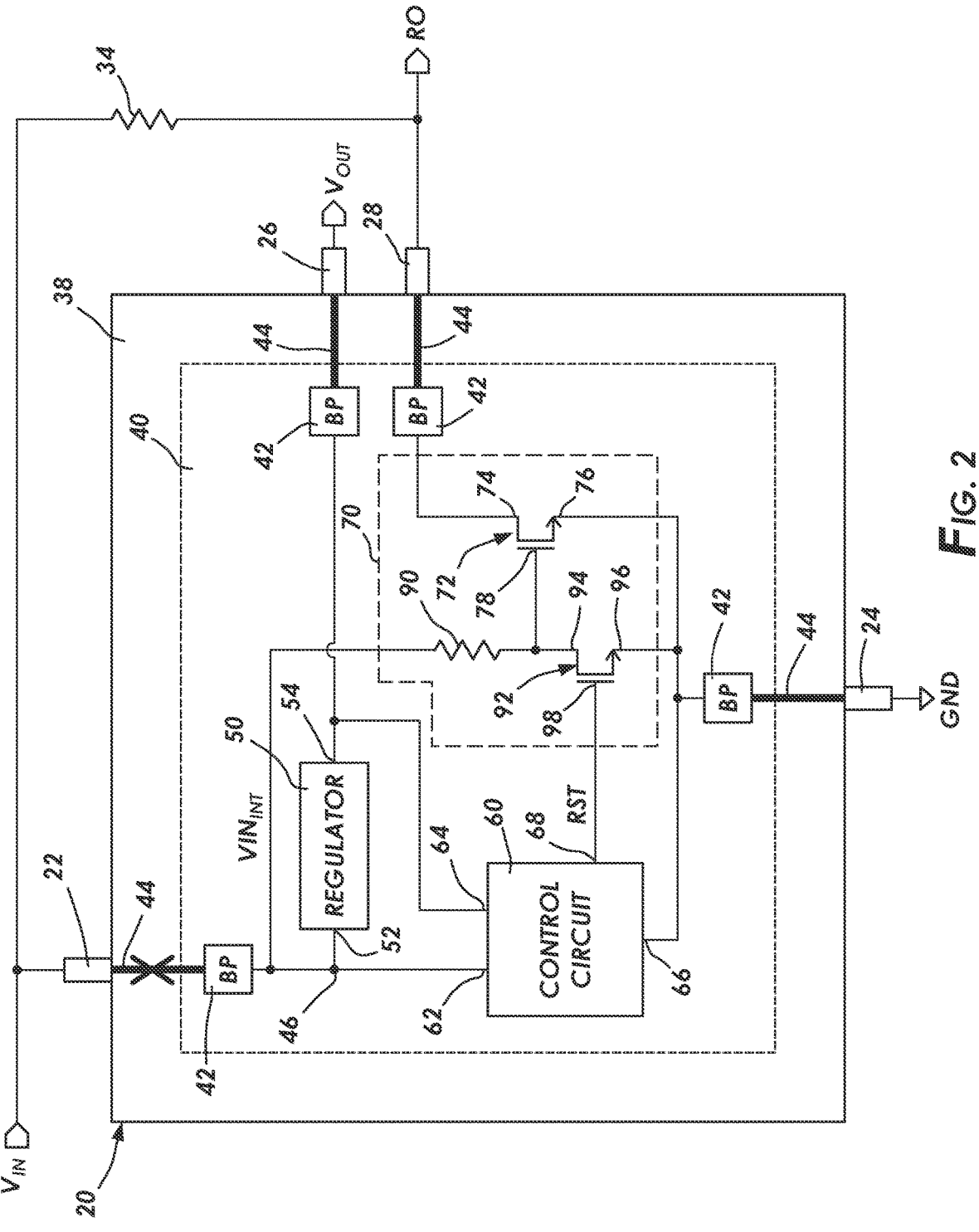
FIG. 2 shows an electrical schematic of a first power management integrated circuit (PMIC) in accordance with at least some embodiments.

FIG. 2 shows an electrical schematic of a first PMIC 20. The first PMIC 20 may include a package 38 defining each of the voltage input terminal 22, the ground terminal 24, the power output terminal 26, and the RO terminal 28. The package 38 of the first PMIC 20 contains a first die 40 of semiconductor material that defines a plurality of bonding pads 42 each connected to a corresponding one of the terminals 22, 24, 26, 28 via a bonding wire 44.

The first PMIC 20 includes a power regulator 50 defining a first input 52 connected to the voltage input terminal 22 via an internal power rail 46, and a regulator output 54 connected to the power output terminal 26. The power regulator 50 may include other inputs and outputs (not shown on the Figures), such as power and/or ground supplies. The power regulator 50 may function to supply power to the power output terminal 26 and at an output voltage. The first PMIC 20 also includes a control circuit 60 that defines a first input 62 connected to the voltage input terminal 22 via the internal power rail 46, a second input 64 connected to the power output terminal 26, a ground connection 66 connected to the ground terminal 24, and a reset output 68. The control circuit 60 may determine an error condition in the first PMIC 20. For example, the control circuit 60 may determine the error condition by determining the output voltage $V_{OUT}$ of the first PMIC 20 being less than a minimum threshold voltage $V_{OUT\_RT}$. Such an error condition may result from the first PMIC 20 being overloaded or from an interruption in a supply power to the first PMIC 20. Additionally or alternatively, the control circuit 60 may determine the internal input voltage $VIN_{INT}$ being outside of a corresponding predetermined range of acceptable values. These are merely examples, and the control circuit 60 may determine one or more other error conditions.

The control circuit 60 may be configured to generate a first reset signal RST in response to detecting the first PMIC 20 is operating without any error conditions. For example, the control circuit 60 may be configured to monitor the output voltage $V_{OUT}$ on the power output terminal 26 and selectively generate a first reset signal RST on the reset output 68 and having a high voltage condition in response to determining the output voltage $V_{OUT}$ being greater than a minimum threshold voltage $V_{OUT\_RT}$. The first reset signal RST may indicate one or more additional conditions, such as the output voltage $V_{OUT}$ being within a predetermined range of acceptable values, the internal input voltage $VIN_{INT}$ being within a predetermined range of acceptable values.

The first PMIC 20 also includes a first output driver 70 connected to the reset output 68 of the control circuit 60 and to the RO terminal 28. The first output driver 70 is configured to selectively drive the RO terminal 28 to a low voltage state based on the first reset signal RST from the control circuit 60.

The first output driver 70 includes a first field-effect transistor (FET) 72 arranged to control a first current from the RO terminal 28 to the ground terminal 24 of the first PMIC 20, selectively driving the RO terminal 28 to a low voltage state, and thereby signaling an error condition in the first PMIC 20. The first FET 72 defines a drain 74 connected to the RO terminal 28, and a source 76 connected to the ground terminal 24. The first FET 72 also has a gate 78. The first output driver 70 of the first PMIC 20 also includes a first internal pull-up resistor 90 that is connected between the voltage input terminal 22 and the gate 78 of the first FET 72. The first internal pull-up resistor 90 may have a resistance of, for example, a few kilo Ohms to several Mega Ohms, with larger resistance values providing a corresponding reduction in quiescent current. However, the first internal pull-up resistor 90 may have a different resistance value.

The first output driver 70 of the first PMIC 20 also includes a second FET 92 to control the flow of current through the first internal pull-up resistor 90 and to the ground terminal 24. The second FET 92 defines a drain 94 connected to the gate 78 of the first FET 72, and a source 96 connected to the ground terminal 24. The second FET 92 also defines a gate 98 that is connected to the reset output 68 of the control circuit 60, having the first reset signal RST.

The first FET 72 and the second FET 92 may be implemented in many cases using an N-type metal-oxide-semiconductor (NMOS) devices shown in the Figures; however, the FET is representative of any device that may be used as an electrically controlled switch (e.g., transistors, junction transistors, Gallium nitride (GaN) High-electron-mobility transistors (HEMT), silicon carbide (SiC) devices, FETs of other types, and silicon-controlled rectifiers).

The second FET 92 of the first output driver 70 is driven to a conductive state by the first reset signal RST. When in the conductive state, the second FET 92 drives the gate 78 of the first FET 72 to a low voltage state, thereby causing the first FET 72 to be in a non-conductive state. With the first FET 72 in the non-conductive state, the external pull-up resistor 34 may conduct current to drive the RO terminal 28 to a high voltage state, thereby signaling the second PMIC 120 operating in a non-error condition.

If the output voltage $V_{OUT}$ ceases to satisfy the predetermined conditions and/or if the internal input voltage $VIN_{INT}$ drops below a predetermined value (for example, if the control circuit 60 loses its connection 62 to node 46), the control circuit 60 drives the reset output 68 to a low voltage state, thereby causing the second FET 92 to be in a non-conductive state.

The internal power rail 46 defines an internal input voltage $VIN_{INT}$. During non-error operation, the internal power rail 46 is each connected to the to the voltage input terminal 22 via a corresponding bonding wire 44, and the internal input voltage $VIN_{INT}$ is substantially equal to the DC input voltage $V_{IN}$ on the voltage input terminal 22. In some cases, and as shown by the X on the bonding wire 44 connecting the first die 40 to the voltage input terminal 22, the bonding wire 44 may be broken, disconnected, or otherwise non-conductive. In case of a failure of the bonding wire 44 connecting the first die 40 to the voltage input terminal 22, the first output driver 70 of the first PMIC 20 will lose its power supply, and therefore lose the ability to control the RO terminal 28 to signal the safety MCU 30 of a failure in the first PMIC 20.

Figure 3:
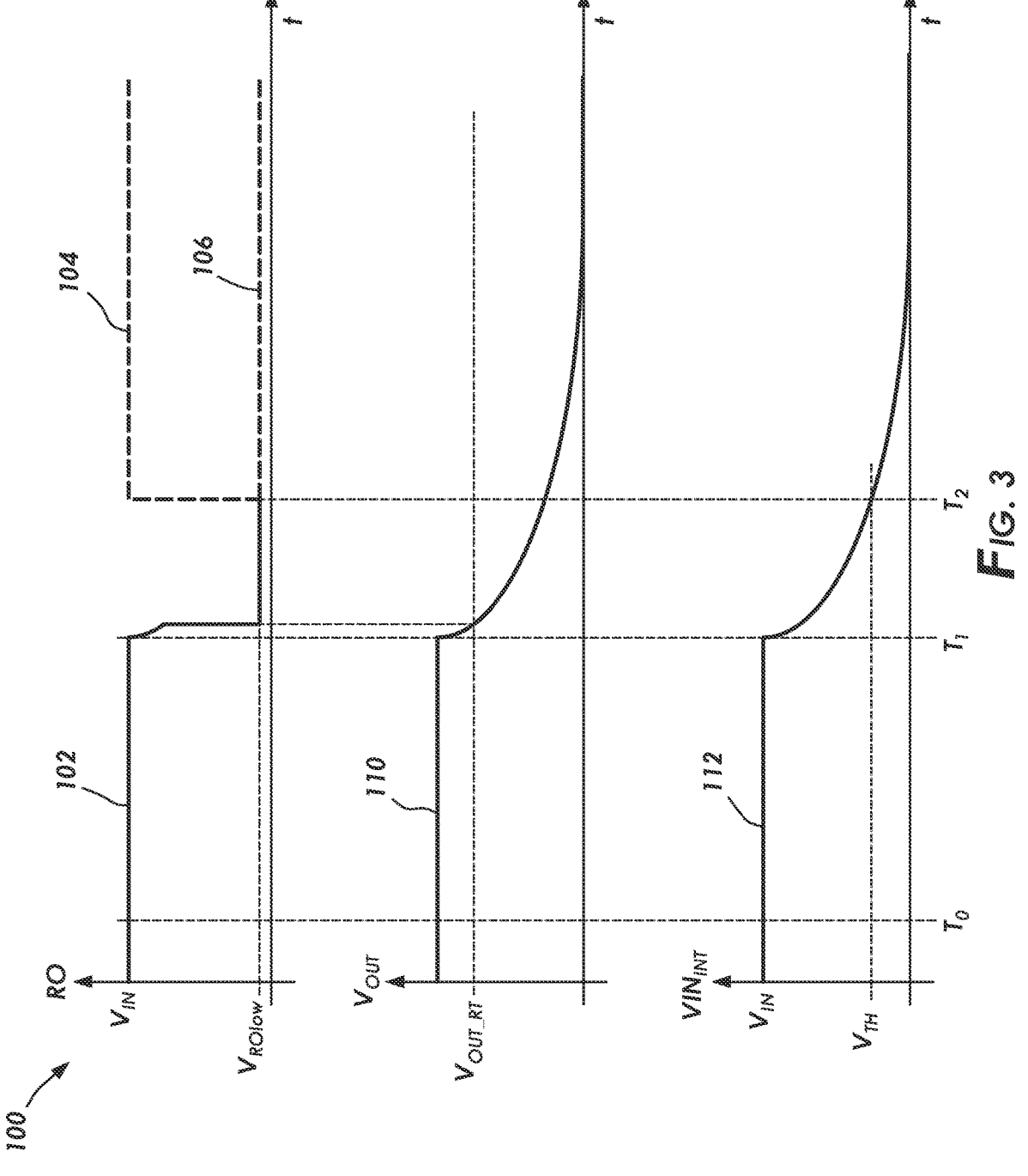
FIG. 3 shows a graph illustrating voltages of three different nodes in the first PMIC of FIG. 2.

FIG. 3 shows a graph including plots 102, 110, 112 of in the first PMIC 20 and over a corresponding time scale. FIG. 3 includes a first plot 102 of the reset output RO, a second plot 110 of the output voltage $V_{OUT}$, and a third plot 112 of the internal input voltage $VIN_{INT}$. During non-error operation, as shown at an initial time $T_0$, the reset output RO has a high voltage state, with a voltage approximately equal to the DC input voltage $V_{IN}$, indicating that the PMIC 20, 120, 220 is operating and without an error condition.

FIG. 3 shows the effect of a failure of the bonding wire 44 connecting the first die 40 to the voltage input terminal 22 at a fault time $T_1$, where the internal input voltage $VIN_{INT}$ and the output voltage $V_{OUT}$ each immediately begin to decay. The rate of decay of the input voltage $VIN_{INT}$ and the output voltage $V_{OUT}$ may depend on load current and other factors, such as capacitance connected to the internal power rail 46. Shortly after the fault time $T_1$, when the output voltage $V_{OUT}$ falls below a minimum threshold voltage $V_{OUT\_RT}$, the first output driver 70 drives the reset output RO to an RO low voltage value $V_{ROlow}$, signaling an error condition in the PMIC 20, 120, 220.

At time $T_2$, when the internal input voltage $VIN_{INT}$ falls below a FET threshold voltage $V_{TH}$ of the first FET 72, the first FET 72 enters a non-conductive state and ceases conducting current between the RO terminal 28 and the ground 24. At that time $T_2$, the reset output RO is pulled to a high voltage state by the external pull-up resistor 34, as indicated by line 104 on FIG. 3. The safety MCU 30 may, therefore receive an erroneous indication that the first PMIC 20 is operating in a non-error condition. The present disclosure provides a second PMIC 120, a third PMIC 220, and method of generating a reset output by a PMIC to cause the reset output RO to be maintained at the correct, low voltage state in case as indicated by line 106 on FIG. 3.

Figure 4:
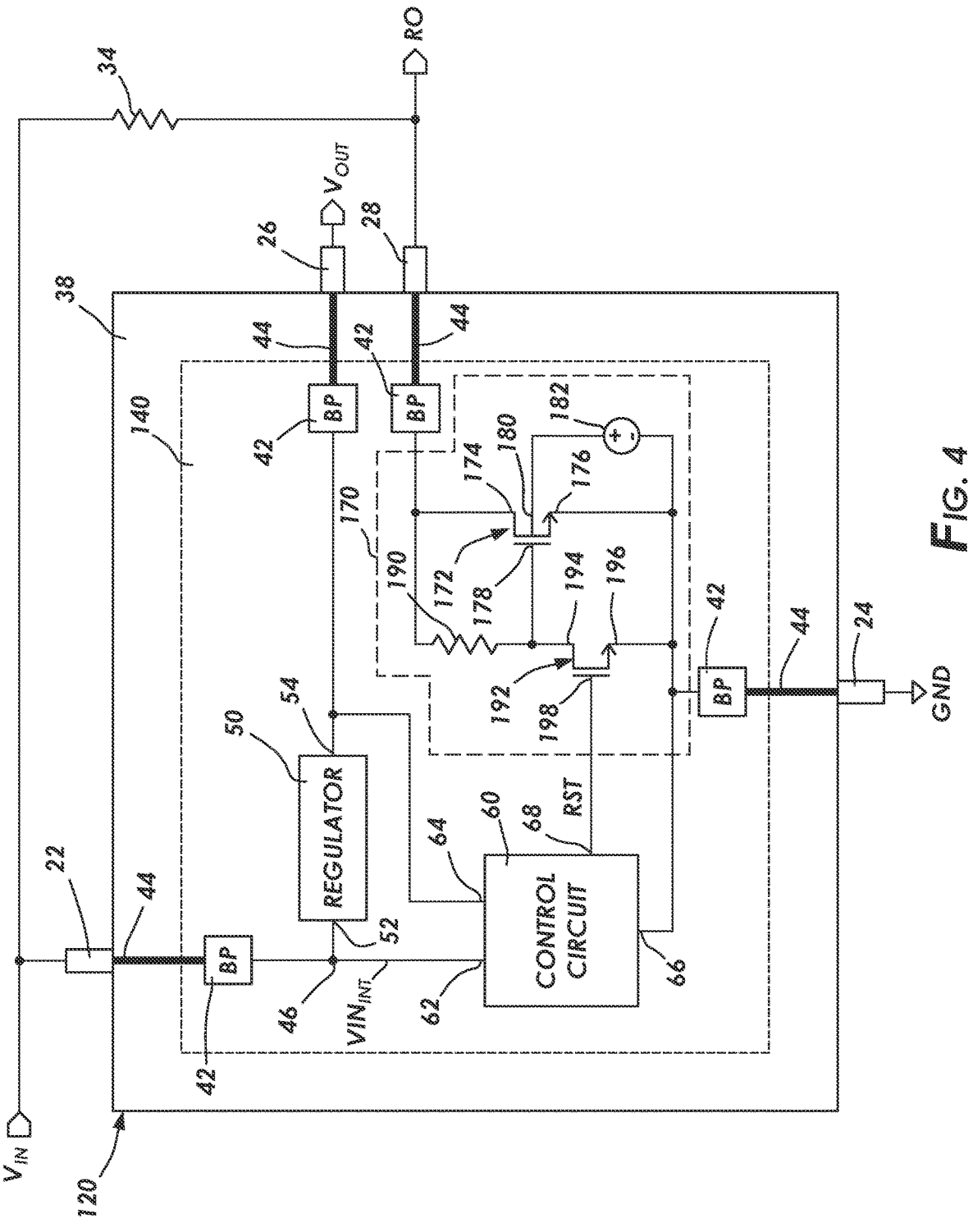
FIG. 4 shows an electrical schematic of a second PMIC in accordance with at least some embodiments.

FIG. 4 shows an electrical schematic of a second PMIC 120 in accordance with at least some embodiments of the present disclosure. The second PMIC 120 includes a package 38 that contains a second die 140 of semiconductor material. The second die 140 of the second PMIC 120 may be similar or identical to the first die 40 of the first PMIC 20, except with a second output driver 170 in place of the first output driver 70 of the first PMIC 20.

The second output driver 170 of the second PMIC 120 is connected to the reset output 68 of the control circuit 60 and to the RO terminal 28. The second output driver 170 is configured to drive the RO terminal 28 to a low voltage state based on the first reset signal RST from the control circuit 60 indicating the output voltage $V_{OUT}$ exceeding the minimum threshold voltage $V_{OUT\_RT}$.

The second output driver 170 includes a third FET 172 arranged to control a first current from the RO terminal 28 to the ground terminal 24 of the second PMIC 120, selectively driving the RO terminal 28 to a low voltage state, and thereby signaling an error condition in the second PMIC 120. The third FET 172 defines a drain 174 connected to the RO terminal 28, and a source 176 connected to the ground terminal 24. The third FET 172 also has a gate 178. The second output driver 170 of the second PMIC 120 also includes a second internal pull-up resistor 190 that is connected between the RO terminal 28 and the gate 78 of the third FET 172. The second internal pull-up resistor 190 may have a resistance of, for example, a few kilo Ohms to several Mega Ohms. However, the second internal pull-up resistor 190 may have a different resistance value.

The second output driver 170 of the second PMIC 120 also includes a fourth FET 192 configured to function as a FET driver circuit for selectively driving the third FET 172 to a non-conductive state in response to the first reset signal RST by selectively conducting current between the gate 178 of the third FET 172 and the ground terminal 24

The fourth FET 192 defines a drain 194 connected to the gate 178 of the third FET 172, and a source 196 connected to the ground terminal 24. The fourth FET 192 also defines a gate 198 that is connected to the reset output 68 of the control circuit 60, communicating the first reset signal RST. The fourth FET 192 functions to selectively drive the third FET 172 to a non-conductive state.

The third FET 172 may have a threshold voltage $V_{TH}$ between 0.0V and the RO low voltage value $V_{ROlow}$. The RO low voltage value $V_{ROlow}$ may have a value of about 0.4V.

Alternatively, and in some embodiments, the third FET 172 may have a threshold voltage $V_{TH}$ that is slightly higher than the RO low voltage value $V_{ROlow}$. For example, the third FET 172 may have a threshold voltage $V_{TH}$ that is a few tenths of a volt greater than the RO low voltage value $V_{ROlow}$.

When the output voltage $V_{OUT}$ is greater than the minimum threshold voltage $V_{OUT\_RT}$, the control circuit 60 sets the reset output 68 to a high voltage state, driving the fourth FET 192 to a conductive state, thus conducting current from the gate 178 of the third FET 172 to the ground terminal 24 and thereby driving the third FET 172 to a non-conductive state. With the third FET 172 in the non-conductive state, the external pull-up resistor 34 biases the RO terminal 28 to a high voltage state, signaling the safety MCU 30 that the second PMIC 120 is operational and in an non-error condition (e.g. with the output voltage $V_{OUT}$ on the power output terminal 26 within predetermined limits).

When the output voltage $V_{OUT}$ is less than the minimum threshold voltage $V_{OUT\_RT}$, the control circuit 60 sets the reset output 68 to a low voltage state, driving the fourth FET 192 to a non-conductive state, with the fourth FET 192 ceasing to conduct current between the gate 178 of the third FET 172 to the ground terminal 24.

When the fourth FET 192 is in the non-conductive state, the second internal pull-up resistor 190 conducts a second current from the RO terminal 28 to the gate 178 of the third FET 172, and a gate-source voltage of the third FET 172 settles on a voltage approximately equal to the RO low voltage value $V_{ROlow}$, and which is greater than the FET threshold voltage $V_{TH}$ of the third FET 172, driving the third FET 172 to a conductive state. Alternatively, the second internal pull-up resistor 190 may conduct the second current from another signal terminal of the PMIC, such as an input signal terminal, an output signal terminal and/or a communications terminal.

In some embodiments, the threshold voltage $V_{TH}$ of the third FET 172 may be modified to be less than the RO low voltage value $V_{ROlow}$, otherwise the third FET 172 may not be in the conductive state when the gate-source voltage of the third FET 172 is approximately equal to the RO low voltage value $V_{ROlow}$. The threshold voltage $V_{TH}$ of the third FET 172 can be lowered by disconnecting a bulk, also called a body, of the third FET 172 from the source 176, and forcing the bulk to a higher voltage. Forcing the bulk of the third FET 172 to the higher voltage causes the threshold voltage $V_{TH}$ of the third FET 172 to be lowered as set forth in equation (1), and due to a phenomenon called body effect:

$$V_{TH} = V_{TH0} + \Upsilon\left(\sqrt{|V_{SB} + 2\phi_F|} - \sqrt{|2\phi_F|}\right) \qquad (1)$$

where $V_{TH}$ is a modified threshold gate-source voltage of the FET, between gate and source terminals, $V_{TH0}$ is an initial threshold gate-source voltage of the FET, $V_{SB}$ is a substrate bias voltage of the FET, between the bulk and the source, $\gamma$ and $\phi_F$ are each constants.

The third FET 172 includes a body 180. A voltage source 182 is connected between the body 180 of the third FET 172 and the ground terminal 24 to apply a DC bias voltage to the body 180. The DC bias voltage should be lower than a PN junction diode conduction voltage of about 0.7 Volts for room temperature. The DC bias voltage may be, for example, 0.3 volts. However, the DC bias voltage may have a different value. The application of the DC biasing voltage to the body 180 of the third FET 172 has the effect of lowering the threshold voltage $V_{TH}$ of the third FET 172 by the body effect.

The third FET 172 and the fourth FET 192 may be implemented in many cases using NMOS type devices shown in the Figures; however, the FET is representative of any device that may be used as an electrically controlled switch (e.g., transistors, junction transistors, Gallium nitride (GaN) High-electron-mobility transistors (HEMT), silicon carbide (SiC) devices, FETs of other types, and silicon-controlled rectifiers).

Figure 5:
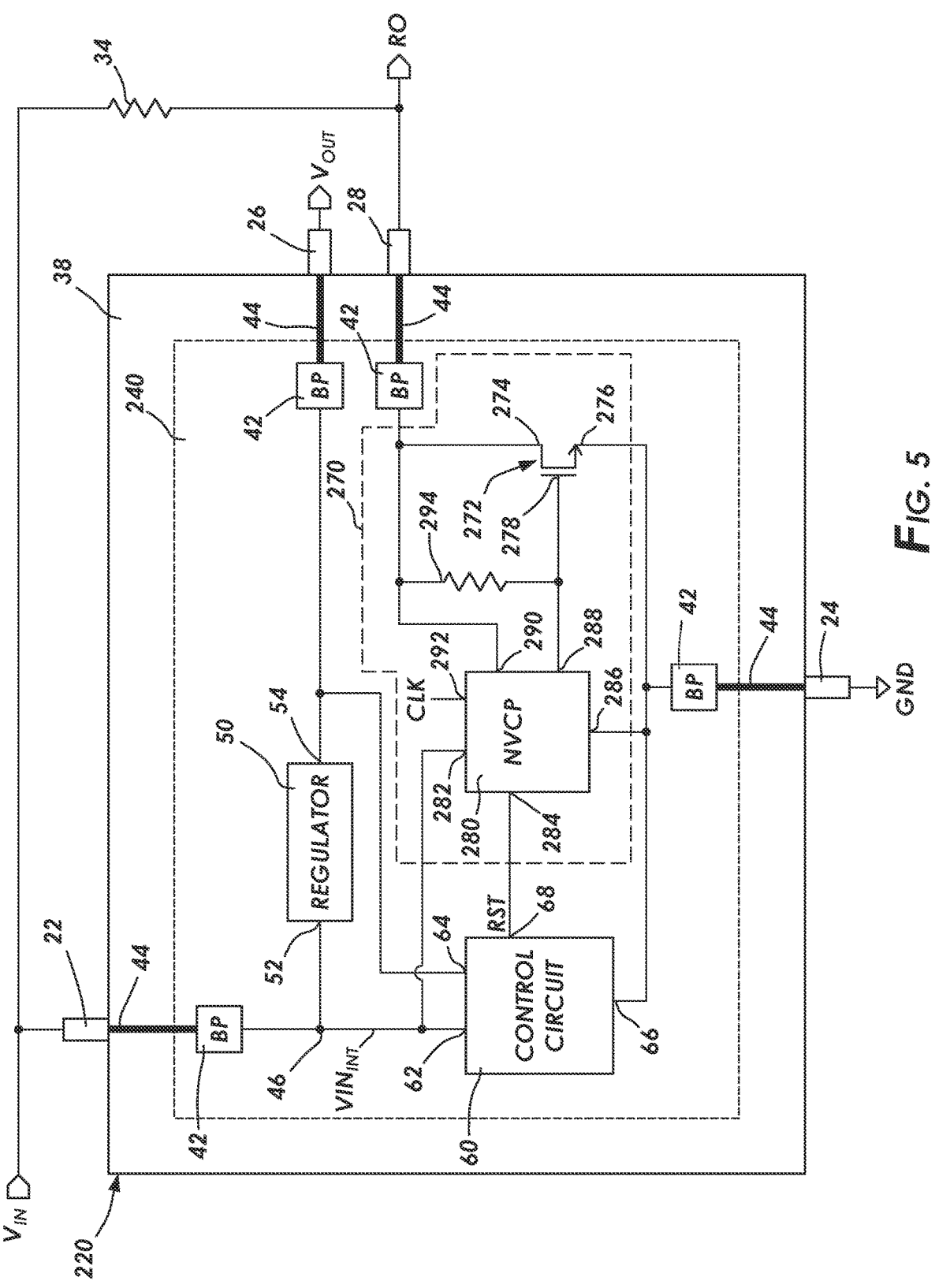
FIG. 5 shows an electrical schematic of a third PMIC in accordance with at least some embodiments.

FIG. 5 shows an electrical schematic of a third PMIC 220 in accordance with at least some embodiments of the present disclosure. The third PMIC 220 includes a package 38 that contains a third die 240 of semiconductor material. The third die 240 of the PMIC 120 may be similar or identical to the second die 140 of the second PMIC 120, except with a third output driver 270 in place of the second output driver 170 of the second PMIC 120.

The third output driver 270 of the third PMIC 220 is connected to the reset output 68 of the control circuit 60 and to the RO terminal 28. The third output driver 270 is configured to drive the RO terminal 28 to a low voltage state based on the first reset signal RST from the control circuit 60 indicating the output voltage $V_{OUT}$ exceeding the minimum threshold voltage $V_{OUT\_RT}$—that is, a non-error condition.

The third output driver 270 includes a fifth FET 272 arranged to control a first current from the RO terminal 28 to the ground terminal 24 of the third PMIC 220, selectively driving the RO terminal 28 to a low voltage state, and thereby signaling an error condition in the third PMIC 220. The fifth FET 272 defines a drain 274 connected to the RO terminal 28, and a source 276 connected to the ground terminal 24. The fifth FET 272 also has a gate 278. The fifth FET 272 may be a native N-type metal-oxide-semiconductor (NMOS) device having a threshold voltage $V_{TH}$ that is less than zero volts. Thus, a negative gate-source voltage may need to be applied between the gate 278 and the source 276 to drive the fifth FET 272 to a non-conductive state.

The third output driver 270 of the third PMIC 220 also includes a third internal pull-up resistor 294 that is connected between the RO terminal 28 and the gate 278 of the fifth FET 272. The third internal pull-up resistor 294 may have a resistance of, for example, a few kilo Ohms to several Mega Ohms. However, the third internal pull-up resistor 294 may have a different resistance value.

The third output driver 270 of the third PMIC 220 also includes a negative voltage charge pump (NVCP) 280 configured to function as a FET driver circuit for selectively driving the fifth FET 272 to a non-conductive state in response to the first reset signal RST by selectively conducting current between the gate 278 of the fifth FET 272 and the ground terminal 24. An example NVCP 280 is discussed in greater detail below.

The NVCP 280 includes a power terminal 282 connected to the internal power rail 46, a reset input 284 connected to the reset output 68 of the control circuit 60, an NVCP ground 286 connected to the ground terminal 24 and having a ground potential GND. The NVCP 280 also includes a negative voltage (NV) driven terminal 288 connected to the gate 278 of the fifth FET 272, an RO startup output 290 connected to the RO terminal 28, and a clock input 292 having a periodic clock signal CLK, which may be produced by a clock circuit (not shown in the Figures).

During non-error operation, the NVCP 280 is operational to create a negative voltage on the on the gate 278 of the fifth FET 272 and which is less than the threshold voltage $V_{TH}$ of the fifth FET 272, driving the fifth FET 272 to a non-conductive state. With the fifth FET 272 in the non-conductive state, the external pull-up resistor 34 may conduct current to drive the RO terminal 28 to a high voltage state, thereby signaling the third PMIC 220 operating in a non-error condition.

If the output voltage $V_{OUT}$ ceases to satisfy the predetermined conditions and/or if the internal input voltage VIN$_{INT}$ drops below a predetermined value (for example, if the voltage input terminal 22 or its corresponding bonding wire 44 becomes disconnected), the control circuit 60 drives the reset output 68 to a low voltage state, causing the NVCP 280 to cease creating the negative voltage on the gate 278 of the fifth FET 272, and thereby causing the fifth FET 272 to be in a conductive state. With the fifth FET 272 in the conductive state, current from the RO terminal 28 is conducted to the ground terminal 24, and the RO terminal 28 is driven to a low voltage state thereby signaling the third PMIC 220 having an error condition.

The fifth FET 272 may have a drain-source voltage that is greater than zero Volts, and a threshold gate-source voltage $V_{TH}$ that is less than zero Volts, which may enable the fifth FET 272 to have a dramatically smaller size with a lower drain-source resistance, when compared to the third FET 172. These savings may offset any additional cost and complexity related to the NVCP 280.

Figure 6:
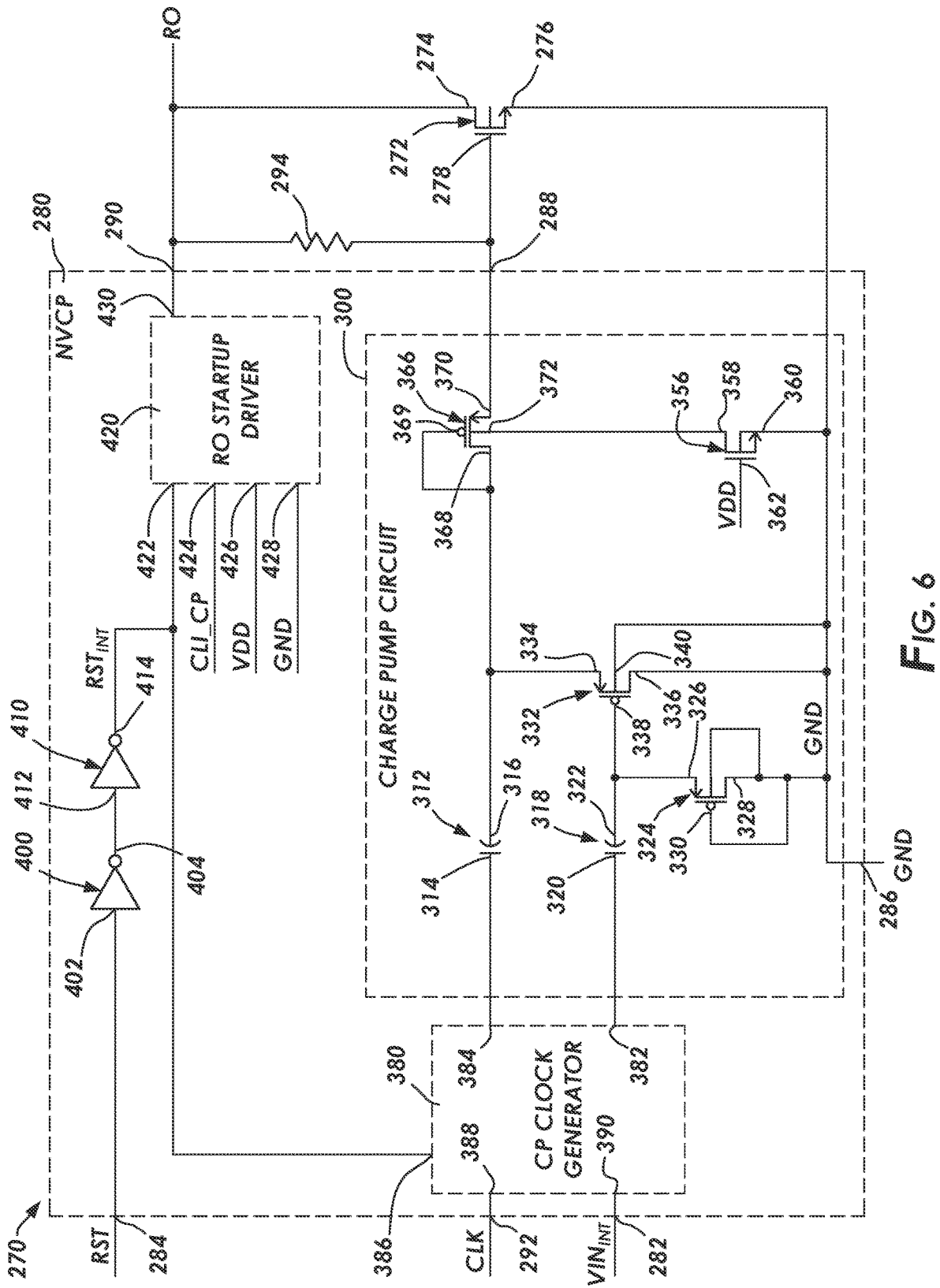
FIG. 6 shows an electrical schematic of a reset output driver circuit of the third PMIC of FIG. 5 and in accordance with at least some embodiments.

FIG. 6 shows an electrical schematic of the third output driver 270, including internal details of the NVCP 280. As shown, the NVCP 280 includes a charge pump (CP) circuit 300 configured to drive a gate voltage on the gate 278 of the fifth FET 272 below the threshold voltage to drive the fifth FET 272 to a non-conductive state. The CP circuit 300 includes a dual negative voltage charge pump with PMOS FETs 324, 332, 366 to eliminate a positive forward PN junction.

The CP circuit 300 includes a first capacitor 312 defining a first terminal 314 connected to an inverted clock output 384 of the CP clock generator 380 providing an inverted clock signal CLK2_CP. The first capacitor 312 defines a capacitance between the first terminal 314 and a first internal node 316.

The CP circuit 300 uses the inverted clock signal CLK2_CP to create a negative voltage on the gate 278 of the fifth FET 272. The CP circuit 300 also includes a second capacitor 318 defining a first terminal 320 connected to a non-inverted clock output 382 of the CP clock generator 380 providing a non-inverted clock signal CLK_CP. The second capacitor 318 defines a capacitance between the first terminal 320 and a second internal node 322.

The CP circuit 300 includes a first P-type metal-oxide-semiconductor (PMOS) FET 324 defining a source 326, a drain 328, and a gate 330. The source 326 of the first PMOS FET 324 is connected to the second internal node 322. The drain 328 and the gate 330 of the first PMOS FET 324 are each connected to the NVCP ground 286.

The CP circuit 300 also includes a second PMOS FET 332 defining a source 334, a drain 336, a gate 338, and a body 340. The source 334 of the second PMOS FET 332 is connected to the first internal node 316. The gate 338 of the second PMOS FET 332 is connected to the second internal node 322. The source 334 of the second PMOS FET 332 is connected to the first internal node 316. The drain 336 and the body 340 of the second PMOS FET 332 are each connected to the NVCP ground 286.

The CP circuit 300 also includes an NMOS FET 356 defining a drain 358, a source 360, and a gate 362 that is connected to an operating power node (not shown in the drawings) having an operating voltage VDD. The operating power node may be connected the power terminal 282. Alternatively, the operating power node may be powered from another source within the PMIC 20, 120, 220.

The CP circuit 300 also includes a third PMOS FET 366 defining a drain 368, a gate 369, a source 370, and a body 372. The source 370 of the third PMOS FET 366 is connected to the NV driven terminal 288. The drain 368 and the gate 369 of the third PMOS FET 366 are each connected to the first internal node 316. The body 372 of the third PMOS FET 366 is connected to the drain 358 of the NMOS FET 356.

The CP circuit 300 uses two clock signals CLK_CP, and CLK2_CP, which provides improved efficiency over alternative designs that use a single clock signal. The CP circuit 300 uses the non-inverted clock signal CLK_CP to create a negative voltage on the gate 338 of the second PMOS FET 332 for shorting the first internal node 316 to the to the NVCP ground 286 when the inverted clock signal CLK2_CP is in a high value state. The CP circuit 300 uses the inverted clock signal CLK2_CP to conduct current from the NV driven terminal 288 and to thereby create a negative voltage on the gate 278 of the fifth FET 272 to drive the fifth FET 272 to a non-conductive state.

Figures 7, 8:
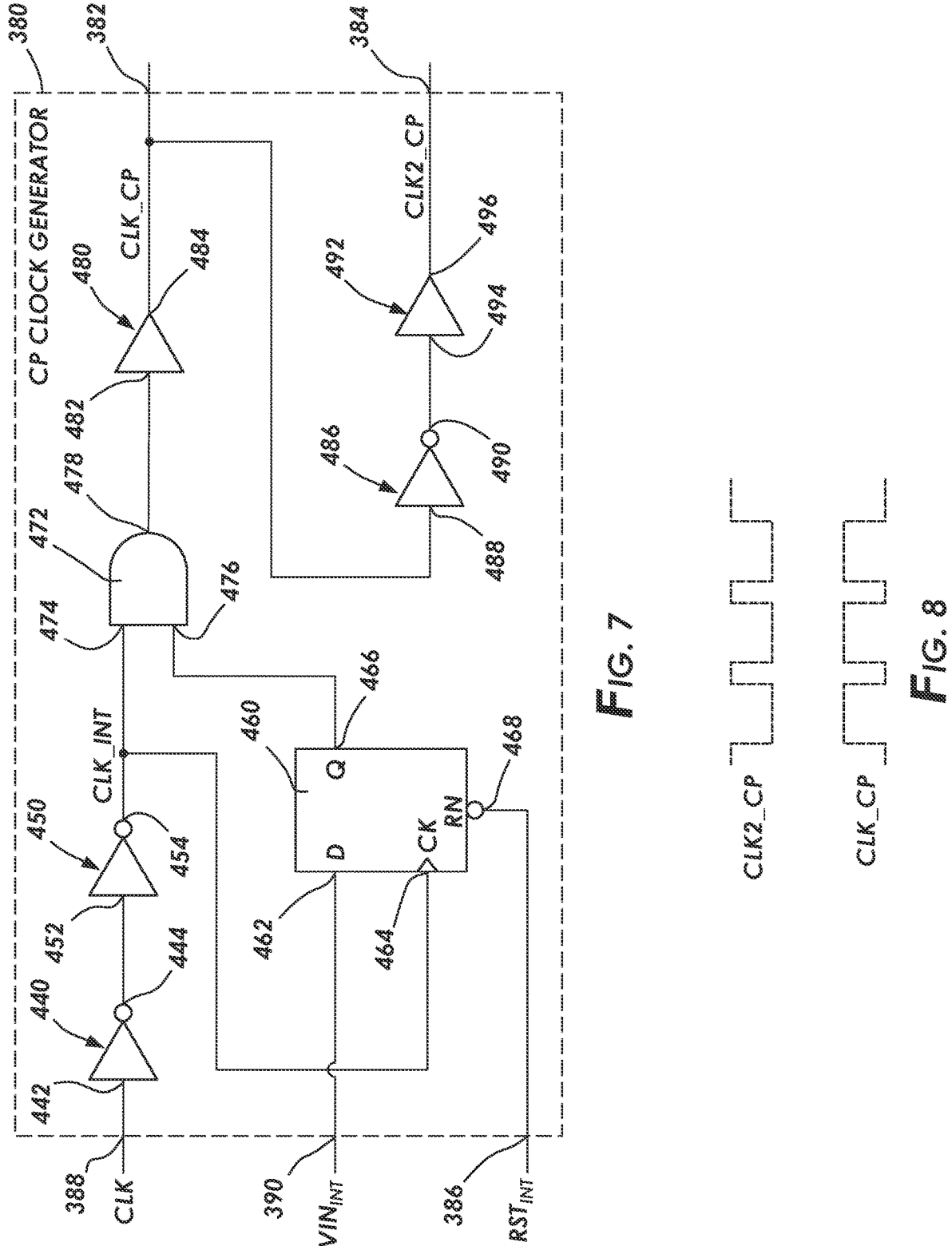
FIG. 7 shows an electrical schematic of a charge pump (CP) clock generator of the reset output driver circuit of FIG. 6 and in accordance with at least some embodiments.
FIG. 8 shows a timing diagram in accordance with at least some embodiments.

The NVCP 280 also includes the CP clock generator 380, which generates the non-inverted clock signal CLK_CP on the non-inverted clock output 382, and the inverted clock signal CLK2_CP on the inverted clock output 384. The CP clock generator 380 also includes a reset input 386 having an internal reset signal RST$_{INT}$ based on the first reset signal RST from the control circuit 60. The CP clock generator 380 also includes a clock input 388 connected to the clock input 292 for receiving the periodic clock signal CLK. The CP clock generator 380 also includes a power input 390 connected to the power terminal 282 and having the internal input voltage VIN$_{INT}$. Internal details of the CP clock generator 380 are shown in FIG. 7.

The NVCP 280 also includes a first inverter 400 defining a first input 402 connected to the reset input 284 for receiving the first reset signal RST. The first inverter 400 also defines a first output 404, which is driven by the first inverter 400 to an inverse of the first reset signal RST. A second inverter 410 includes a second input 412 that is connected to the first output 404 of the first inverter 400. The second inverter 410 also includes a second output 414 that is driven by the second inverter 410 to an inverse of the signal on the second input 412, and defining the internal reset signal RST$_{INT}$, which is connected to the reset input 386 of the CP clock generator 380. Together, the first inverter 400 and the second inverter 410 provide a buffering function to generate the internal reset signal RST$_{INT}$ with a same logical value (high voltage or low voltage) as the first reset signal RST, with a very small delay.

The NVCP 280 also includes an RO startup driver 420, which is configured to selectively conduct a third current between the RO terminal 28 and the ground terminal 24 of the third PMIC 220, thereby driving the RO terminal 28 to a low voltage state based on the first reset signal RST from the control circuit 60.

The RO startup driver 420 selectively conducts the third current for a first predetermined period of time after a beginning of the reset signal RST (i.e. after the internal reset signal RST$_{INT}$ transitions from a low voltage condition to a high voltage condition). The first predetermined period of time may be three clock cycles, as determined by the control signal generator 500. However, the first predetermined period of time may have a different length of time. The first predetermined period of time is longer than a pull-down time for the CP circuit 300 to drive the gate voltage of the fifth FET 272 below its threshold voltage $V_{TH}$.

The RO startup driver 420 also selectively conducts the third current for a second period of time after an ending of the reset signal RST (i.e. after the internal reset signal $RST_{INT}$ transitions from a high voltage condition to a low voltage condition). The second period of time is longer than a time for the third internal pull-up resistor 294 to drive a gate voltage of the fifth FET 272 above its threshold voltage $V_{TH}$, providing some overlap between the RO startup driver 420 pulling the RO output signal to the low-voltage condition, and when the fifth FET 272 is conductive to pull the RO output signal to the low-voltage condition. Thus, the second period of time provides for the third PMIC 220 to generate the low-voltage condition of the RO output signal without interruption.

The RO startup driver 420 includes a reset input 422 connected to the second output 414 of the second inverter 410 for receiving the internal reset signal $RST_{INT}$. The RO startup driver 420 also includes a clock input 424 connected to the non-inverted clock output 382 of the CP clock generator 380 for receiving the non-inverted clock signal CLK_CP. The RO startup driver 420 also includes a power input 426 connected to the operating power node having the operating voltage VDD, and a ground connection 428 connected to the ground terminal 24 and having the ground potential GND. The RO startup driver 420 also includes an RO control terminal 430 connected to the RO terminal 28 via the RO startup output 290.

FIG. 7 shows an electrical schematic of the CP clock generator 380, which includes a first inverter 440 defining a first input terminal 442 connected to the clock input 388 for receiving the periodic clock signal CLK. The first inverter 440 also defines a first output terminal 444, which is driven by the first inverter 440 to an inverse of the periodic clock signal CLK. A second inverter 450 includes a second input terminal 452 that is connected to the first output terminal 444 of the first inverter 440. The second inverter 450 also includes a second output 454 that is driven by the second inverter 450 to an inverse of the signal on the second input 452, and defining an internal clock signal CLK_INT. Together, the first inverter 440 and the second inverter 450 provide a buffering function to generate internal clock signal CLK_INT based on the periodic clock signal CLK, with a very small delay.

The CP clock generator 380 also includes a first flip-flop 460 configured as a D flip-flop having a first data input 462, a first clock input 464, a first output 466, and a first reset input 468. The first data input 462 is connected to the power input 390 for receiving the internal input voltage $VIN_{INT}$. The first reset input 468 is connected to the reset input 386 of the CP clock generator 380, having the internal reset signal $RST_{INT}$. The first flip-flop 460 is configured to drive the first output 466 to a value matching a value on the first data input 462 upon a rising edge of a signal on the first clock input 464 and to maintain the state of the first output 466 until a subsequent rising edge of the signal on the first clock input 464 or unless it is reset. The first flip-flop 460 is configured to drive the first output 466 to a low voltage state in response to the first reset input 468 being in an active state, and regardless of the state of the first data input 462 or the first clock input 464. The first reset input 468 is active low. Accordingly, the first flip-flop 460 functions to drive the first output 466 to the low voltage state in response to the internal reset signal $RST_{INT}$ having a low voltage state.

The CP clock generator 380 also includes an AND gate 472 defining a first input 474, a second input 476, and an output terminal 478. The first input 474 of the AND gate 472 is connected to the second output 454 of the second inverter 450 for receiving the internal clock signal CLK_INT. The second input 476 is connected to the first output 466 of the first flip-flop 460. The AND gate 472 drives the output terminal 478 to a high voltage state if and only if both the first input 474 and the second input 476 are each in the high voltage state.

The CP clock generator 380 also includes a first buffer 480 having an input terminal 482 connected to the output terminal 478 of the AND gate 472, and an output terminal 484 connected to the non-inverted clock output 382 for providing the non-inverted clock signal CLK_CP.

The CP clock generator 380 also includes a third inverter 486 defining a third input terminal 488 connected to the non-inverted clock output 382 for receiving the non-inverted clock signal CLK_CP. The third inverter 486 also defines a third output terminal 490, which is driven by the third inverter 486 to an inverse of the non-inverted clock signal CLK_CP. The CP clock generator 380 also includes a second buffer 492 having an input terminal 494 connected to the third output terminal 490 of the third inverter 486, and an output 496 connected to the inverted clock output 384 for providing the inverted clock signal CLK2_CP.

The AND gate 472 and the first flip-flop 460 of the CP clock generator 380 function together to cause the non-inverted clock signal CLK_CP and the inverted clock signal CLK2_CP to each have a steady state condition in response to the internal reset signal $RST_{INT}$ having a low voltage state, thereby stopping the CP circuit 300. The steady state condition includes the non-inverted clock signal CLK_CP having a low voltage state, and the inverted clock signal CLK2_CP having a high voltage state. With the CP circuit 300 stopped, current from the RO terminal 28 and through the third internal pull-up resistor 294 will increase a gate voltage of the fifth FET 272, driving the fifth FET 272 to a conductive state and driving the RO terminal 28 to a low voltage state, signaling the third PMIC 220 having an error condition.

FIG. 8 shows a timing diagram, illustrating the inverted clock signal CLK2_CP and the non-inverted clock signal CLK_CP over a common time scale. As illustrated, the inverted clock signal CLK2_CP has an inverse value of the non-inverted clock signal CLK_CP at any given time.

Figure 9:
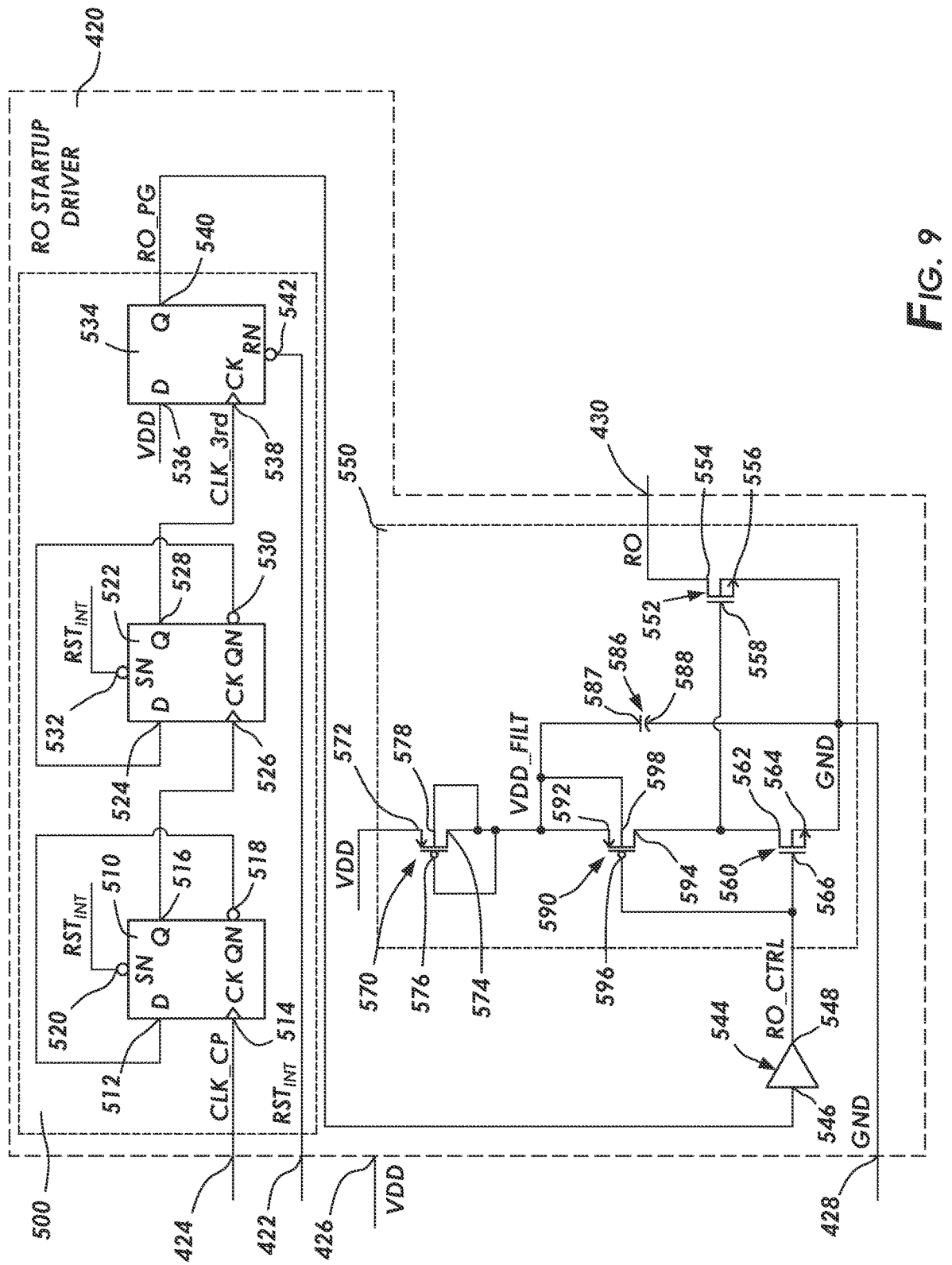
FIG. 9 shows an electrical schematic of a reset output startup driver of the reset output driver circuit of FIG. 6 and in accordance with at least some embodiments.

FIG. 9 shows an electrical schematic illustrating internal details of the RO startup driver 420. The RO startup driver 420 functions to drive the RO terminal 28 to a low voltage state when the internal input voltage $VIN_{INT}$ is present and the internal reset signal $RST_{INT}$ has a low-voltage condition, and also for three clock cycles after an initial startup (when the internal reset signal $RST_{INT}$ transitions from a low voltage condition to a high voltage condition).

RO startup driver 420 also functions to quickly drive the RO terminal 28 to a low voltage state based on the internal reset signal $RST_{INT}$, and before a gate voltage of the fifth FET 272 rises above a threshold voltage to cause the fifth FET 272 to be in a conductive state. The RO startup driver 420 includes a control signal generator 500 configured to generate an internal RO control signal RO_PG. The RO startup driver 420 includes an RO driver circuit 550 configured to selectively conduct current between the RO control terminal 430 and the ground connection 428 based on the RO control signal RO_PG from the control signal generator 500.

The control signal generator 500 includes a second flip-flop 510 configured as a D flip-flop having a second data input 512, a second clock input 514, a second non-inverting output 516, a second inverting output 518, and a second SN input 520. The second data input 512 is connected to the second inverting output 518. The second clock input 514 is connected to the clock input 424 of the RO startup driver 420 and having the non-inverted clock signal CLK_CP. The second SN input 520 is connected to the reset input 422 having the internal reset signal $RST_{INT}$. The second flip-flop 510 is configured to drive the second non-inverting output 516 to a value matching a value on the second data input 512 upon a rising edge of a signal on the second clock input 514 and to drive the second inverting output 518 to an inverse of the value on the second non-inverting output 516. The second flip-flop 510 is also configured to maintain a state of each of the second non-inverting output 516 and the second inverting output 518 until a subsequent rising edge on the second clock input 514, or unless a setting override function is activated based on a signal applied to the second SN input 520. The second flip-flop 510 is configured to drive the second non-inverting output 516 to a high voltage state in response to the second SN input 520 being in an active state, and regardless of the state of the second data input 512 or the second clock input 514. The second SN input 520 is active low. Accordingly, the second flip-flop 510 functions to drive the second non-inverting output 516 to the high voltage state and to drive the second inverting output 518 to the low voltage state in response to the internal reset signal $RST_{INT}$ having a low voltage state.

The control signal generator 500 includes a third flip-flop 522 configured as a D flip-flop having a third data input 524, a third clock input 526, a third non-inverting output 528, a third inverting output 530, and a third SN input 532. The third data input 524 is connected to the third inverting output 530. The third clock input 526 is connected to the second non-inverting output 516 of the second flip-flop 510. The third SN input 532 is connected to the reset input 422 having the internal reset signal $RST_{INT}$. The third flip-flop 522 is configured to drive the third non-inverting output 528 to a value matching a value on the third data input 524 upon a rising edge of a signal on the third clock input 526 and to drive the third inverting output 530 to an inverse of the value on the third non-inverting output 528. The third flip-flop 522 is also configured to maintain a state of each of the third non-inverting output 528 and the third inverting output 530 until a subsequent rising edge on the third clock input 526, or unless a setting override function is activated based on a signal applied to the third SN input 532. The third flip-flop 522 is configured to drive the third non-inverting output 528 to a high voltage state in response to the third SN input 532 being in an active state, and regardless of the state of the third data input 524 or the third clock input 526. The third SN input 532 is active low. Accordingly, the third flip-flop 522 functions to drive the third non-inverting output 528 to the high voltage state and to drive the third inverting output 530 to the low voltage state in response to the internal reset signal $RST_{INT}$ having a low voltage state.

When the setting override function is not activated (i.e. when the internal reset signal $RST_{INT}$ has a high voltage value, indicating no error in the third PMIC 220), the second flip-flop 510 and the third flip-flop 522 together generate a slow clock signal CLK_3rd based on the periodic clock signal CLK and having a period for times longer than a period of the periodic clock signal CLK. As shown in the timing diagram on FIG. 10, the slow clock signal CLK_3rd has a first rising edge after three pulses of the periodic clock signal CLK.

Referring back to FIG. 9, the control signal generator 500 includes a fourth flip-flop 534 configured as a D flip-flop having a fourth data input 536, a fourth clock input 538, a fourth non-inverting output 540, and a fourth RN input 542. The fourth data input 536 is connected to the power input 426 having the operating voltage VDD. The fourth clock input 538 is connected to the third non-inverting output 528 of the third flip-flop 522, having the slow clock signal CLK_3rd. The fourth RN input 542 is connected to the reset input 422 having the internal reset signal $RST_{INT}$. The fourth flip-flop 534 is configured to drive the fourth non-inverting output 540 to a value matching a value on the fourth data input 536 upon a rising edge of a signal on the fourth clock input 538. The fourth flip-flop 534 is also configured to maintain a state of the fourth non-inverting output 540 until a subsequent rising edge on the fourth clock input 538, or unless a reset override function is activated based on a signal applied to the fourth RN input 542. The fourth flip-flop 534 is configured to drive the fourth non-inverting output 540 to a low voltage state in response to the fourth RN input 542 being in an active state, and regardless of the state of the fourth data input 536 or the fourth clock input 538. The fourth RN input 542 is active low. Accordingly, the fourth flip-flop 534 functions to drive the fourth non-inverting output 540 to the low voltage state in response to the internal reset signal $RST_{INT}$ having a low voltage state.

The RO startup driver 420 also includes a third buffer 544 having an input terminal 546 connected to the fourth non-inverting output 540 of the fourth flip-flop 534 for receiving the RO control signal RO_PG from the control signal generator 500. The third buffer 544 also includes an output 548 connected to the RO driver circuit 550 and for providing a buffered control signal RO_CTRL based on the RO control signal RO_PG.

The RO driver circuit 550 also includes a fourth PMOS FET 570 defining a drain 574, a gate 576, a source 572, and a body 578. The source 572 of the fourth PMOS FET 570 is connected to the power input 426 having the operating voltage VDD. The drain 574, the gate 576, and the body 578 of the fourth PMOS FET 570 are each connected to a common node defining a filtered operating voltage VDD_FILT.

The RO driver circuit 550 includes a sixth FET 552 to selectively control a flow of current between the RO control terminal 430 and the ground connection 428 for driving the RO terminal 28 to GND. The sixth FET 552 defines a drain 554 connected to the RO control terminal 430, and a source 556 connected to the ground connection 428. The sixth FET 552 also has a gate 558.

The RO driver circuit 550 also includes a seventh FET 560 to selectively control a voltage on the gate 558 of the sixth FET 552. The seventh FET 560 defines a drain 562 connected to the gate 558 of the sixth FET 552, and a source 564 connected to the ground connection 428. The seventh FET 560 also has a gate 566 that is connected to the output 548 of the third buffer 544 having the buffered control signal RO_CTRL.

The RO driver circuit 550 includes an eighth FET 590. The eighth FET 590 defines a drain 594, a gate 596, a source 592, and a body 598. The source 592 and the body 598 of the eighth FET 590 are each connected to the common node having the filtered operating voltage VDD_FILT. The gate 596 of the eighth FET 590 is connected to the output 548 of the third buffer 544 having the buffered control signal RO_CTRL.

The sixth FET 552 and the seventh FET 560 may be implemented in many cases using an N-type metal-oxide-semiconductor (NMOS) devices shown in the Figures. The eighth FET 590 may be implemented in many cases using a P-type metal-oxide-semiconductor (PMOS) device shown in the Figures. However, the FET is representative of any device that may be used as an electrically controlled switch (e.g., transistors, junction transistors, Gallium nitride (GaN) High-electron-mobility transistors (HEMT), silicon carbide (SiC) devices, FETs of other types, and silicon-controlled rectifiers).

The RO driver circuit 550 selectively conducts current between the he RO terminal 28, via the RO control terminal 430, and the ground terminal 24, via the ground connection 428, and based on the RO control signal RO_PG from the control signal generator 500. The RO driver circuit 550 is operational while power is supplied to the voltage input terminal 22 of the third PMIC 220, and for a period of time after the voltage input terminal 22 becomes de-energized, as the third capacitor 586 is discharged and the filtered operating voltage VDD_FILT gradually drops.

The seventh FET 560 and the eighth FET 590, together, selectively conduct a fourth current between the gate 558 of the sixth FET 552 and one of the common node defining the filtered operating voltage VDD_FILT, or the ground connection 428 having the ground potential GND, based on the buffered control signal RO_CTRL. The seventh FET 560 and the eighth FET 590, thereby operate to selectively drive the sixth FET 552 between a conductive state and a non-conductive state based on the buffered control signal RO_C-TRL.

When the buffered control signal RO_CTRL has a low voltage state, the eighth FET 590 is driven to a conductive state, conducting current between the common node defining the filtered operating voltage VDD_FILT and the gate 558 of the sixth FET 552, thereby driving the sixth FET 552 to a conductive state, and conducing current between the RO control terminal 430 and the ground connection 428, and thereby operating the RO startup driver 420 to conduct a third current between the RO terminal 28 and the ground terminal 24 of the third PMIC 220, driving the RO terminal 28 to a low voltage state.

When the buffered control signal RO_CTRL has a high voltage state, the seventh FET 560 is driven to a conductive state, conducting current between the gate 558 of the sixth FET 552 and the ground connection 428, thereby driving the sixth FET 552 to a non-conductive state, and thereby operating the RO startup driver 420 to not affect a state of the RO terminal 28.

The RO driver circuit 550 also includes a third capacitor 586 defining a first terminal 587 connected to the common node defining the filtered operating voltage VDD_FILT. The third capacitor 586 defines a capacitance between the first terminal 587 and a second terminal 588 that is connected to the ground connection 428 and having the ground potential GND. The third capacitor 586 functions to provide a supply voltage for the eighth FET 590 and for a corresponding time that is longer than a time necessary to pull the gate 278 of the fifth FET 272 to a voltage that is higher than the threshold voltage $V_{TH}$, to drive the fifth FET 272 to its conductive state, in case the operating voltage VDD is lost (e.g. in case of a broken bond wire). The fourth PMOS FET 570 may function as a diode connected between the power input 426 having the operating voltage VDD and the common node defining the filtered operating voltage VDD-_FILT. The fourth PMOS FET 570 may operate to prevent the capacitor 586 from discharging in case the operating voltage VDD goes to a low voltage value.

Figure 10:
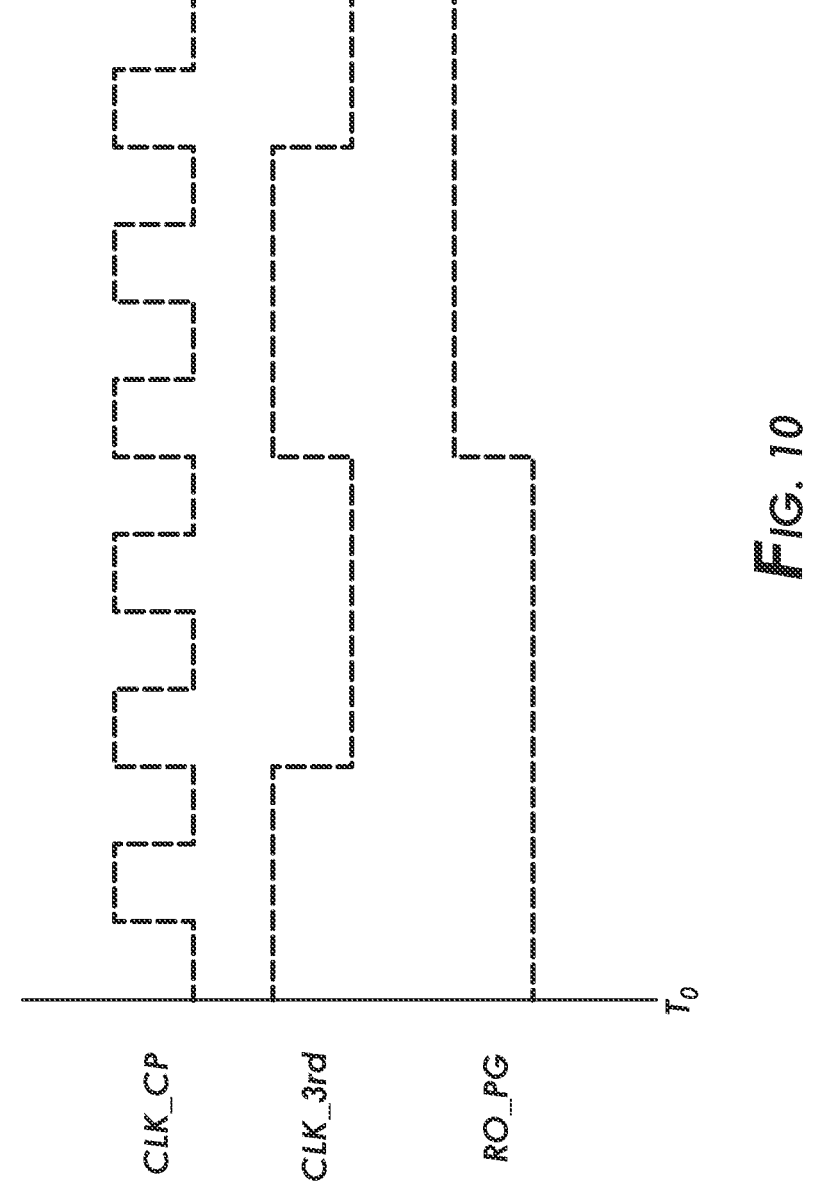
FIG. 10 shows a timing diagram in accordance with at least some embodiments.

FIG. 10 shows a timing diagram showing the non-inverted clock signal CLK_CP, the slow clock signal CLK_3rd, and the RO control signal RO_PG, all over a common time scale. As shown on FIG. 10, the RO control signal RO_PG changes its value from low to high with the fourth rising edge of the non-inverted clock signal CLK_CP. As also shown on FIG. 10, the slow clock signal CLK_3rd has a first rising edge that coincides with a fourth rising edge of the non-inverted clock signal CLK_CK after an initial time To, which represents a time when the internal reset signal $RST_{INT}$ first changes from the low voltage state to the high voltage state, after power is supplied to the third PMIC 220 and the control circuit 60 determines the output voltage $V_{OUT}$ being greater than the minimum threshold voltage $V_{OUT\_RT}$. FIG. 10 also shows the RO control signal RO_PG having a low voltage state from the initial time To, and until a first rising edge of the slow clock signal CLK_3rd, which takes place after three clock cycles after the initial time To.

Figure 11:
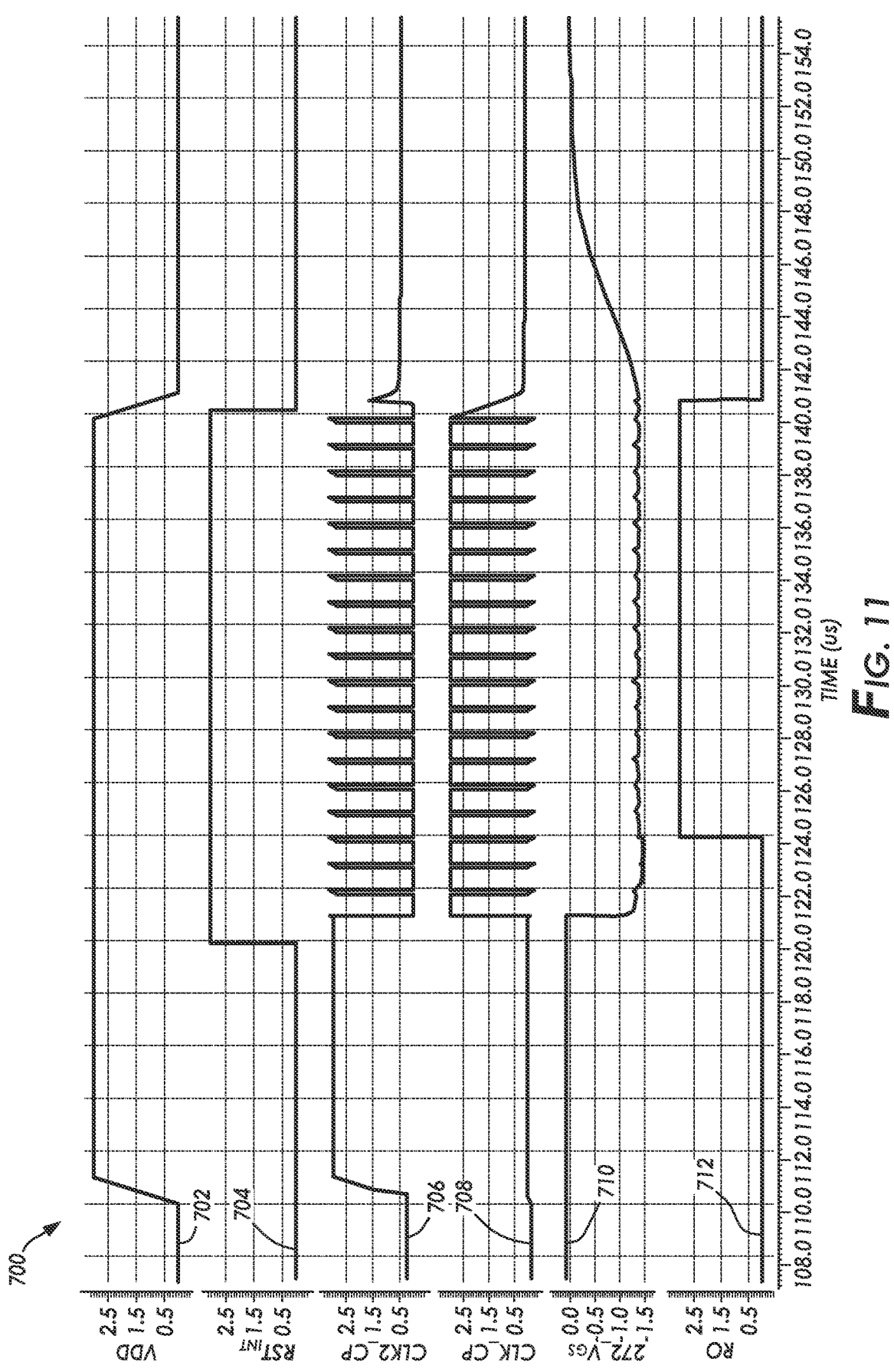
FIG. 11 shows a graph with plots of several signals in the third PMIC of FIG. 5 over a common time scale and in accordance with at least some embodiments.

FIG. 11 shows a graph 700 with plots 702, 704, 706, 708, 710, 712 of several signals in the third PMIC 220, and over a common time scale. The graph 700 includes a first plot 702 of the operating voltage VDD, a second plot 704 of the internal reset signal $RST_{INT}$, a third plot 706 of the inverted clock signal CLK2_CP, and a fourth plot 708 of the non-inverted clock signal CLK_CP. The graph 700 also includes a fifth plot 710 of a gate-source voltage $272\_V_{GS}$ between the gate 278 and the source 276 of the fifth FET 272. The gate-source voltage $272\_V_{GS}$ of the fifth FET 272 may control operation of that device, and may therefore represent an operating mode of the fifth FET 272 for selectively conducting a first current between the RO terminal 28 and the ground terminal 24 of the third PMIC 220, driving the RO terminal 28 to a low voltage state, and thereby signaling an error condition in the third PMIC 220. The graph 700 also includes a sixth plot 712 of the reset output signal RO on the RO terminal 28 of the third PMIC 220.

FIG. 11 also illustrates a de-bounce function of the RO startup driver 420. As shown on the sixth plot 712, the reset output signal RO has a rising edge, transitioning from a low voltage state to a high voltage state at about time 124.0 microseconds (µs), which is about 4.0 µs after the internal reset signal $RST_{INT}$ rises to the high voltage state, as shown on the second plot 704. This delay of about 4.0 µs results from the RO driver circuit 550 conducting the third current for the period of time determined by the control signal generator 500, from the initial time To and until a first rising edge of the slow clock signal CLK_3rd. This delay of about 4.0 µs provides a de-bounce function, preventing the reset output signal RO from rapidly cycling with the first reset signal RST. This delay may be be longer or shorter than 4.0 µs. The timing of this delay may depend on several factors, such as frequency of the clock signal, and external conditions like supply voltage and temperature. The length of this delay should be longer than a time necessary to pull the voltage on the gate 278 above the threshold voltage $V_{TH}$ of the fifth FET 272, in case the CP circuit 300 stops working.

The graph 700 of FIG. 11 illustrates another function of the RO startup driver 420 to rapidly drive the reset output signal RO to the low voltage state the internal reset signal $RST_{INT}$ drops to the low voltage state, and before the gate-source voltage $272\_V_{GS}$ of the fifth FET 272 rises to a level sufficient to cause the fifth FET 272 to become conductive. As shown on the fifth plot 710, the gate-source voltage $272\_V_{GS}$ of the fifth FET 272 slowly rises from its low voltage state over about 10 microseconds ($\mu s$) after the after the internal reset signal $RST_{INT}$ falls to the low voltage state. This time does not to be exactly 10 $\mu s$. Its value may depend on several variables, such as resistance value of the external pull-up resistor 34, resistance value of the third internal pull-up resistor 294, size of the fifth FET 272, temperature, and the input voltage $V_{IN}$.

This slow rising of the gate-source voltage $272\_V_{GS}$ results from residual charge on the capacitors 312, 318 of the CP circuit 300, and may cause a delay before the fifth FET 272 becomes conductive. As shown on the sixth plot 712, the reset output signal RO transitions from a high voltage state to a low voltage state at about time 141.0 $\mu s$, which is about 1.0 $\mu s$ after the internal reset signal $RST_{INT}$ falls to the low voltage state, and before the gate-source voltage $272\_VGS$ of the fifth FET 272 rises above a corresponding threshold voltage to cause the fifth FET 272 to become conductive. However, this time does not to be exactly 1 us. Its value depends on several variables, such as temperature and the input voltage $V_{IN}$. The RO driver circuit 550 conducts the third current for an initial period of time after the internal reset signal $RST_{INT}$ transitions to the high voltage state.

The RO driver circuit 550 also conducts the third current after the internal reset signal $RST_{INT}$ falls to the low voltage state and for period of time until the filtered operating voltage VDD_FILT drops below a threshold value, when the sixth FET 552 becomes non-conductive. This period of time that the RO driver circuit 550 conducts the third current is longer than a period of time after the internal reset signal $RST_{INT}$ falls to the low voltage state, and until the gate-source voltage $272\_V_{GS}$ of the fifth FET 272 rises above a corresponding threshold voltage to cause the fifth FET 272 to become conductive, thereby providing some overlap between the fifth FET 272 conducting the first current, and the RO driver circuit 550 conducting the third current, and maintaining the reset output signal RO on the RO terminal 28 consistently in the low voltage state after the internal reset signal $RST_{INT}$ drops to the low voltage state.

Figure 12:
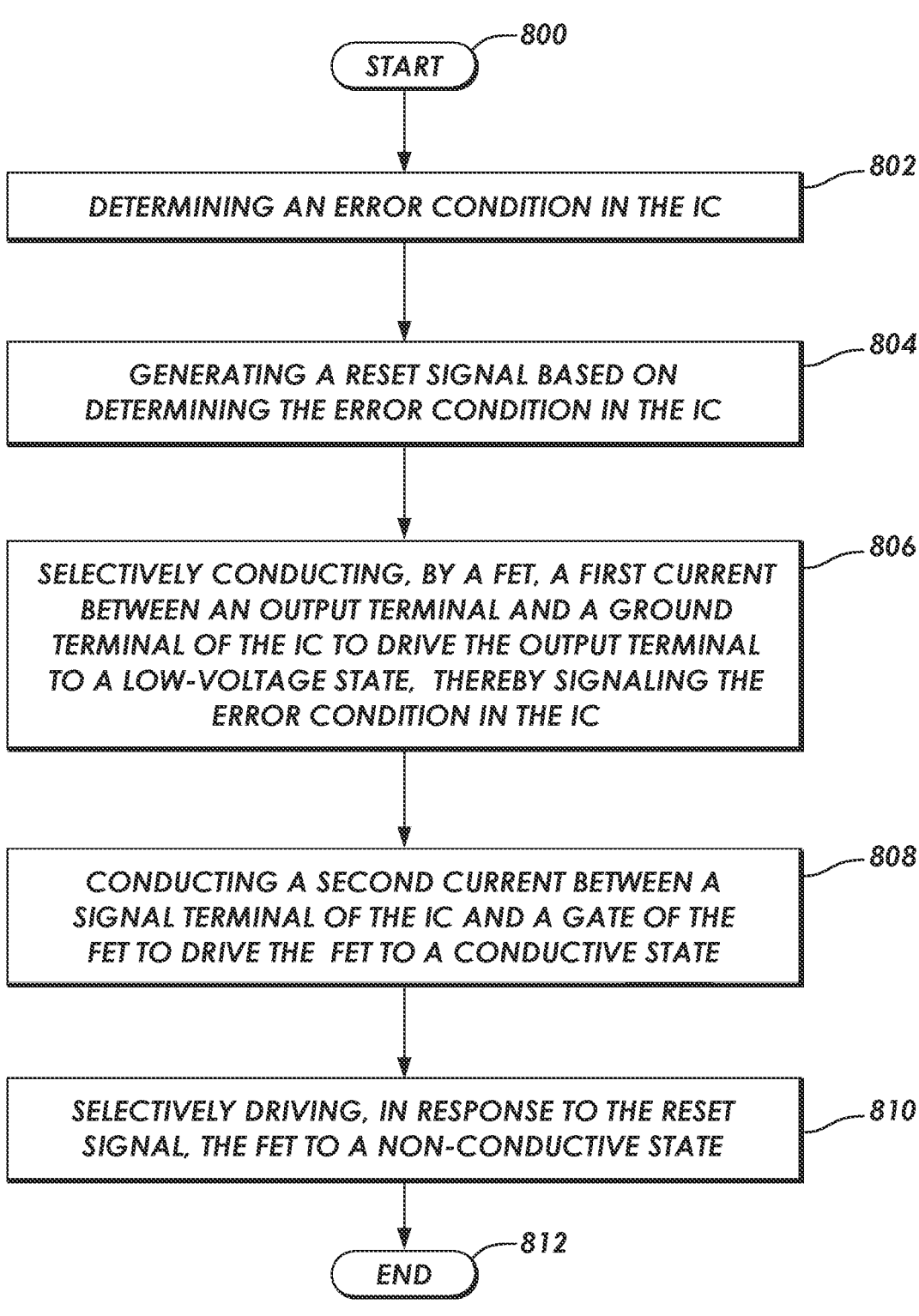
FIG. 12 shows a flow chart listing method steps in accordance with at least some embodiments.

FIG. 12 shows a flow chart listing steps in a method of operating an output of an integrated circuit (IC) in accordance with at least some embodiments. In particular, the method starts (block 800) and comprises: determining an error condition in the IC (block 802). For example, the control circuit 60 may determine the error condition as the output voltage $V_{OUT}$ being less than a minimum threshold voltage $V_{OUT\_RT}$. However, other conditions, such as an input voltage out of a predetermined range and/or the output voltage $V_{OUT}$ being greater than a predetermined maximum voltage may represent error conditions in the PMIC.

The method also includes generating a reset signal based on determining the error condition in the IC (block 804). For example, the control circuit 60 may generate the first reset signal RST by selectively setting the reset output 68 to a high voltage state when no error condition is present in the PMIC.

The method also includes selectively conducting, by a field-effect transistor (FET), a first current between an output terminal and a ground terminal of the IC to drive the output terminal to a low voltage state, and thereby signaling the error condition (block 806). For example, the third FET 172 of the second PMIC 120 or the fifth FET 272 of the third PMIC 220 may selectively conduct the first current between the RO terminal 28 and the ground terminal 24 to drive the RO terminal 28 to a low voltage state, thereby signaling the error condition.

The method also includes conducting a second current between a signal terminal of the IC and a gate of the FET to drive the FET to a conductive state (block 808). For example, second internal pull-up resistor 190 of the second PMIC 120 or the third internal pull-up resistor 294 of the third PMIC 220 may be connected between the RO terminal 28 and a gate of a corresponding one of the third FET 172 or the fifth FET 272 to conduct a second current therebetween and to drive the corresponding one of the third FET 172 or the fifth FET 272 to a conductive state. However, another signal terminal of the PMIC, such as an input signal terminal, an output signal terminal and/or a communications terminal, may be used to supply the second current.

The method also includes selectively driving, in response to the reset signal, the FET to a non-conductive state. (block 810). For example, a FET driver circuit, such as the fourth FET 192 of the second PMIC 120 or the NVCP 280 of the third PMIC 220 may be connected to the reset output 68 of the control circuit 60 and configured to selectively drive a corresponding one of the third FET 172 or the fifth FET 272 to a non-conductive state in response to the first reset signal RST. Thereafter the method ends (block 812).

In some embodiments, the signal terminal of the PMIC is the reset output terminal. However, the signal terminal of the PMIC may be another terminal configured to communicate one or more signals to and/or from the PMIC.

In some embodiments, the method further includes generating a regulated output power having an output voltage. For example, the power regulator 50 of the second PMIC 120 or the third PMIC 220 may generate the regulated output power having the output voltage on the regulator output 54, which is connected to the power output terminal 26 of the corresponding one of the second PMIC 120 or the third PMIC 220.

In some embodiments, the method further includes comparing the output voltage with a minimum threshold voltage value to determine the output voltage being below the minimum threshold voltage value. For example, the control circuit 60 of the second PMIC 120 or the third PMIC 220 may compare the output voltage $V_{OUT}$ with a minimum threshold voltage $V_{OUT\_RT}$, which may have a constant value, to determine if the output voltage $V_{OUT}$ is less than the minimum threshold voltage $V_{OUT\_RT}$. Determining the error condition may include determining the output voltage being below the minimum threshold voltage value. For example, a determination that the output voltage $V_{OUT}$ is less than the minimum threshold voltage $V_{OUT\_RT}$ may be indicative of the PMIC 20, 120, 220 having an error condition, such as operating in an overloaded condition.

In some embodiments, conducting the second current to drive the FET to the conductive state (block 808) includes conducting the second current via an internal pull-up resistor of the PMIC to apply a voltage on a gate of the FET in excess of a threshold voltage, and thereby driving the FET to the conductive state. For example, the second internal pull-up resistor 190 or the third internal pull-up resistor 294 may conduct the second current between the RO terminal 28 and a gate 178, 278 of a corresponding one of the third FET 172 or the fifth FET 272 to drive the corresponding one of the third FET 172 or the fifth FET 272 to the conductive state.

In some embodiments, the FET is an N-type metal-oxide-semiconductor (NMOS) device having a threshold voltage between 0 Volts and a reset output low signal voltage, and driving the FET to the conductive state (block 808) includes applying a voltage on a gate of the FET in excess of the threshold voltage, and the reset output terminal having the reset output low signal voltage signals the error condition in the PMIC.

In some embodiments, the FET further defines a body, and the method further comprises lowering the threshold voltage of the FET by applying a positive direct current (DC) voltage to the body of the FET. For example, and as shown in FIG. 4, a voltage source 182, which represents bias voltage, may be connected between the body 180 of the third FET 172 and the ground terminal 24 to apply a DC bias voltage to the body 180, thereby lowering the threshold voltage $V_{TH}$ of the third FET 172.

In some embodiments, the FET is an N-type metal-oxide-semiconductor (NMOS) device having a threshold voltage that is less than 0 Volts; and the method further includes selectively driving, by a negative voltage charge pump (NVCP), a gate voltage of the FET below the threshold voltage to drive the FET to the non-conductive state. For example, and as shown in FIGS. 5-6, an NVCP 280, including a CP circuit 300 may be configured to drive a gate voltage on the gate 278 of the fifth FET 272 below the threshold voltage to drive the fifth FET 272 to a non-conductive state.

In some embodiments, the method further includes generating an inverted clock signal as an inverse of a non-inverted clock signal; and the step of driving, by the NVCP, the gate voltage of the FET below the threshold voltage includes switching current from a negative voltage driven terminal connected to a gate of the FET using each of the non-inverted clock signal and the inverted clock signal. For example, and as shown in FIGS. 6-7, a charge pump (CP) clock generator 380 may be configured to generate an inverted clock signal CLK2_CP and a non-inverted clock signal CLK_CP, with the inverted clock signal CLK2_CP being an inverse of the non-inverted clock signal CLK_CP. The CP circuit 300 may use both of the inverted clock signal CLK2_CP and the non-inverted clock signal CLK_CP to switch current from the NV driven terminal 288 to drive the gate voltage on the gate 278 of the fifth FET 272 below its corresponding threshold voltage In some embodiments, the method further includes selectively conducting, for a period of time after an ending of the reset signal, a third current between the reset output terminal and the ground terminal of the PMIC. For example, the RO startup driver 420 may rapidly drive the reset output signal RO to the low voltage state after the internal reset signal $RST_{INT}$ drops to the low voltage state, and before the gate-source voltage $272\_V_{GS}$ of the fifth FET 272 rises to a level sufficient to cause the fifth FET 272 to become conductive. The RO driver circuit 550 conducts the third current after the internal reset signal $RST_{INT}$ falls to the low voltage state and for period of time until the filtered operating voltage VDD_FILT drops below a threshold value, when the sixth FET 552 becomes non-conductive. In some embodiments, the period of time is longer than a pull-up time for the second current to drive the FET from a non-conductive state and to the conductive state. For example, the period of time that the RO driver circuit 550 conducts the third current may be longer than a period of time after the internal reset signal $RST_{INT}$ drops to the low voltage state and until the gate-source voltage $272\_V_{GS}$ of the fifth FET 272 rises above a corresponding threshold voltage to cause the fifth FET 272 to become conductive, thereby providing some overlap between the fifth FET 272 conducting the first current and the RO driver circuit 550 conducting the third current, and maintaining the reset output signal RO on the RO terminal 28 consistently in the low voltage state after the internal reset signal $RST_{INT}$ changes from the high voltage state to the low voltage state.

In some embodiments, the method further includes selectively conducting, for a period of time after a beginning of the reset signal, a third current between the reset output terminal and the ground terminal of the PMIC. For example, the RO startup driver 420 may signal the RO driver circuit 550 via the RO control signal RO_PG, causing the RO driver circuit 550 to conduct the third current for a period of time determined by the control signal generator 500, and after the internal reset signal $RST_{INT}$ changes from the low voltage state to the high voltage state.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method of operating an output of an integrated circuit (IC), comprising:

determining an error condition in the IC;

generating a reset signal based on the determining the error condition in the IC;

selectively conducting, by a field-effect transistor (FET), a first current between an output terminal and a ground terminal of the IC to drive the output terminal to a low voltage state, thereby signaling the error condition in the IC;

conducting a second current between a signal terminal of the IC and a gate of the FET to drive the FET to a conductive state; and selectively driving, in response to the reset signal, the FET to a non-conductive state, wherein the signal terminal of the IC is the output terminal.

2. The method of claim 1, further comprising:

generating a regulated output power having an output voltage; and comparing the output voltage with a minimum threshold voltage value to determine the output voltage being below the minimum threshold voltage value, wherein determining the error condition in the IC includes determining the output voltage being below the minimum threshold voltage value.

3. The method of claim 1, wherein conducting the second current to drive the FET to the conductive state includes conducting the second current via an internal pull-up resistor of the IC to apply a voltage on the gate of the FET in excess of a threshold voltage, and thereby driving the FET to the conductive state.

4. The method of claim 1, wherein the FET is an N-type metal-oxide-semiconductor (NMOS) device having a threshold voltage between 0 Volts and an output low signal voltage, wherein driving the FET to the conductive state includes applying a voltage on the gate of the FET in excess of the threshold voltage, and wherein the output terminal having the output low signal voltage signals the error condition in the IC.

5. The method of claim 4, wherein the FET further defines a body, and wherein the method further comprises lowering the threshold voltage of the FET by applying a positive direct current (DC) voltage to the body of the FET.

6. The method of claim 1, wherein the FET is an N-type metal-oxide-semiconductor (NMOS) device having a threshold voltage that is less than 0 Volts.

7. The method of claim 6, further comprising selectively driving, by a negative voltage charge pump (NVCP), a gate voltage of the FET below the threshold voltage to drive the FET to the non-conductive state.

8. The method of claim 6, further comprising:

selectively conducting, for a period of time after an ending of the reset signal, a third current between the output terminal and the ground terminal of the IC;

wherein the period of time is longer than a pull-up time for the second current to drive the FET from a non-conductive state and to the conductive state.

9. The method of claim 6, further comprising selectively conducting, for a period of time after a beginning of the reset signal, a third current between the output terminal and the ground terminal of the IC.

10. An integrated circuit (IC), comprising:

a control circuit defining a reset terminal and configured to determine an error condition in the IC and to generate a reset signal on the reset terminal, based on determining the error condition in the IC;

a field-effect transistor (FET) defining a drain connected to an output terminal of the IC, and a source connected to a ground terminal of the IC, the FET configured to selectively conduct a first current between the output terminal and the ground terminal to drive the output terminal to a low voltage state, thereby signaling the error condition in the IC;

an internal pull-up resistor connected between a signal terminal of the IC and a gate of the FET to conduct a second current therebetween and to drive the FET to a conductive state; and a FET driver circuit connected to the reset terminal of the control circuit and configured to selectively drive the FET to a non-conductive state in response to the reset signal, wherein the FET is an N-type metal-oxide-semiconductor (NMOS) device having a threshold voltage that is less than 0 Volts, and wherein the FET driver circuit comprises a negative voltage charge pump (NVCP) configured to selectively drive a gate voltage of the FET below the threshold voltage to drive the FET to the non-conductive state in response to the reset signal.

11. The IC of claim 10, wherein the signal terminal of the IC is the output terminal.

12. The IC of claim 10, further comprising:

a power regulator connected to a power output terminal of the IC and configured to supply power to the power output terminal at an output voltage;

wherein the control circuit is further configured to compare the output voltage on the power output terminal with a minimum threshold voltage value to determine the error condition in the IC by determining the output voltage being below the minimum threshold voltage value.

13. The IC of claim 10, wherein conducting the second current to drive the FET to the conductive state includes conducting the second current through the internal pull-up resistor to apply a voltage on the gate of the FET in excess of a threshold voltage, and thereby driving the FET to the conductive state.

14. An integrated circuit (IC), comprising:

a control circuit defining a reset terminal and configured to determine an error condition in the IC and to generate a reset signal on the reset terminal, based on determining the error condition in the IC;

a field-effect transistor (FET) defining a drain connected to an output terminal of the IC, and a source connected to a ground terminal of the IC, the FET configured to selectively conduct a first current between the output terminal and the ground terminal to drive the output terminal to a low voltage state, thereby signaling the error condition in the IC;

an internal pull-up resistor connected between a signal terminal of the IC and a gate of the FET to conduct a second current therebetween and to drive the FET to a conductive state; and a FET driver circuit connected to the reset terminal of the control circuit and configured to selectively drive the FET to a non-conductive state in response to the reset signal; and an RO driver circuit, including:

a second FET defining a drain connected to the output terminal of the IC, and a source connected to the ground terminal of the IC, and configured to selectively conduct a third current between the output terminal and the ground terminal of the IC;

a voltage regulator configured to produce a filtered operating voltage on a common node using an operating power from an input terminal of the IC;

a capacitor connected between the common node and the ground terminal to maintain the filtered operating voltage on the common node; and a third FET defining a drain connected to a gate of the second FET, and a source connected to the common node;

wherein the third FET is configured to selectively conduct a fourth current between the common node and the gate of the second FET to drive the second FET to a conductive state, thereby conducting the third current between the output terminal and the ground terminal of the IC for a period of time after an ending of the reset signal, while the capacitor maintains the filtered operating voltage at a value sufficient to drive the second FET to a conductive state; and wherein the period of time is longer than a pull-up time for the second current to drive the FET from the non-conductive state to the conductive state.

15. A power supply circuit for a system in a vehicle, comprising:

a power source having a power output terminal;

a safety microcontroller unit (MCU) having a signal input terminal; and a power management integrated circuit (PMIC) including:

a voltage input terminal, a ground terminal, a power output terminal, and a signal output terminal, wherein the voltage input terminal is connected to the power output terminal of the power source for receiving power therefrom, and wherein the signal output terminal is connected to the signal input terminal of the safety MCU for signaling an error condition in the PMIC;

a control circuit defining a reset terminal and configured to determine the error condition in the PMIC and to generate a reset signal on the reset terminal based on determining the error condition in the PMIC;

a field-effect transistor (FET) defining a drain connected to the signal output terminal, and a source connected to the ground terminal, the FET configured to selectively conduct a first current between the signal output terminal and the ground terminal to drive the signal output terminal to a low voltage state, thereby signaling the error condition in the PMIC;

an internal pull-up resistor connected between the signal output terminal and a gate of the FET to conduct a second current therebetween and to drive the FET to a conductive state; and a FET driver circuit connected to the reset terminal of the control circuit and configured to selectively drive the FET to a non-conductive state in response to the reset signal.

\* \* \* \* \*